(12) United States Patent
Kobayashi et al.

(10) Patent No.: US 7,435,515 B2
(45) Date of Patent: *Oct. 14, 2008

(54) PROCESS FOR PRODUCTION OF PATTERN-FORMING BODY

(75) Inventors: Hironori Kobayashi, Tokyo-to (JP); Masato Okabe, Tokyo-to (JP); Manabu Yamamoto, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/004,535

(22) Filed: Dec. 3, 2004

(65) Prior Publication Data

US 2005/0084776 A1    Apr. 21, 2005

Related U.S. Application Data

(62) Division of application No. 09/953,597, filed on Sep. 12, 2001, now Pat. No. 6,846,616.

(51) Int. Cl.
*G02B 5/20* (2006.01)
*G02B 3/00* (2006.01)

(52) U.S. Cl. .............................. 430/7; 430/16; 430/17; 430/321; 359/619; 359/642

(58) Field of Classification Search ........................ None
See application file for complete search history.

(56) References Cited

U.S. PATENT DOCUMENTS 5,948,576 A * 9/1999 Shirota et al. .................. 430/7

6,294,313 B1 * 9/2001 Kobayashi et al. .......... 430/302
6,846,616 B2 * 1/2005 Kobayashi et al. .......... 430/311

FOREIGN PATENT DOCUMENTS

EP         0 718 644 A  *  6/1996
WO         WO99/08158   *  2/1999

* cited by examiner

*Primary Examiner*—John A. McPherson
(74) *Attorney, Agent, or Firm*—Ladas & Parry LLP

(57) ABSTRACT

A primary object of the present invention is to provide a process for the production of a pattern-forming body, the process enabling the formation of a highly precise pattern, requiring no post-exposure treatment and being free from a fear as to the deterioration of the pattern-forming body itself because no photocatalyst is contained in the produced pattern-forming body. In the present invention, the above problem can be solved by providing a process for the production of a pattern-forming body, the process comprising disposing a catalyst-containing layer-side substrate containing at least a photocatalyst-containing layer and a pattern-forming body substrate containing a characteristic-changeable layer which is changed in characteristics by the action of the photocatalyst in at least said photocatalyst-containing layer such that the photocatalyst-containing layer is in contact with the characteristic-changeable layer, followed by performing exposure to thereby change the characteristics of the exposed portion of the characteristic-changeable layer and thereafter dismounting the photocatalyst-containing layer-side substrate, thereby obtaining a pattern-forming body having a pattern which has been changed in characteristics on the characteristic-changeable layer.

7 Claims, 7 Drawing Sheets

PROCESS FOR PRODUCTION OF PATTERN-FORMING BODY

BACKGROUND OF THE INVENTION

The present invention relates to a process for the production of a novel pattern-forming body usable in various applications including printing.

In the process for the production of pattern-forming bodies wherein various patterns such as designs, images, characters and circuits are formed on a substrate, various pattern-forming bodies are produced.

Explanations will be furnished taking the case of a printing process as an example. With regard to a planographic printing plate used for planographic printing which is a kind of printing method, a planographic printing plate having a pattern comprising a hydrophilic section which accepts ink and a section which does not accept any printing ink is produced, an ink image to be printed on the hydrophilic section is formed by using the planographic plate and the formed image is transferred to, for example, paper to carry out printing. In such printing, a pattern such as characters and figures is formed on a printing master plate to make a printing plate as a pattern-forming body, which is installed on a printer and used. Various types have been proposed as a printing master plate for offset printing which is a typical planographic printing plate.

A printing plate for offset printing can be produced using, for example, a method in which a planographic printing master plate is exposed through a patterned mask and developed or a method in which a printing master plate is directly exposed using an electrophotographic system to plate-make directly on the printing master plate. An electrophotographic offset printing master plate is produced using a method in which a light conductive layer containing, as its major components, a light conductive particle such as zinc oxide and a binder resin is formed on a conductive substrate, this light conductive layer as a light-sensitive body is exposed using an electrophotographic system to form a highly hydrophilic image on the surface of the light-sensitive body and in succession, the light-sensitive body is treated using a fat-insensitizing solution to make the non-image portion hydrophilic, thereby obtaining an offset master plate, namely a pattern-forming body. The hydrophilic portion is made lipophobic by dipping it in water or the like, printing ink is accepted by the lipophilic image portion and the image portion is transferred to paper or the like. However, various post-exposure treatments such as the treatment using a fat-insensitizing solution are required.

Also, a method of producing a planographic printing master plate has been proposed, the method using a heat mode recording material capable of forming a pattern comprising a highly ink-acceptable section and an ink-repellent section by laser radiation. The heat mode recording material has the characteristics that it does not require process such as a developing process and can produce a printing plate only by simply forming an image by laser light. This recording material poses problems concerning the control of the strength of a laser, the treatments of residuals such as solid-like materials denatured by a laser and printing durability.

Also, as a method for forming a highly precise pattern, methods of the production of a pattern-forming body using photolithography in which a photoresist layer applied to a substrate is subjected to pattern exposure, and in succession to the exposure, the photoresist is developed and further etching is carried out or a photoresist is exposed to light by using a functional material as the photoresist to form an objective pattern directly are known.

The method of forming a highly precise pattern using photolithography is used for the formation of a colored pattern of a color filter used in liquid crystal displays and the like, the formation of microlenses, the production of precise electric circuit substrates, the production of a chrome mask used for pattern exposure and the like. However, a photoresist is used and it is necessary to develop using a liquid developer and to carry out etching after the exposure depending on the types of method. These methods therefore have the problem that a necessity of treating waste liquids arises. Also, when a functional material is used as the photoresist, there is the problem that the photoresist is deteriorated by an alkaline solution and the like which are used in a developing process.

Although a highly precise pattern of a color filter and the like is formed by printing or the like, the pattern formed by printing has problems concerning positional accuracy and it is therefore difficult to form a pattern with high accuracy.

Meanwhile, for instance, a method of producing a pattern-forming body wherein a pattern is formed using a material which is changed in wettability by the action of a photocatalyst has been studied by the inventors of the present invention to solve such problems. However, the conventional methods of producing a pattern-forming body by the action of a photocatalyst have the problems that there is a possibility of a deterioration caused by the photocatalyst depending on the type of pattern-forming body because the photocatalyst is structurally contained in the pattern-forming body itself to be produced.

SUMMARY OF THE INVENTION

The present invention has been made in view of the foregoing problems and it is an object of the present invention to provide a process for the production of a pattern-forming body, the process being capable of forming a pattern with high accuracy, requiring no post-treatment after exposure and being free from a fear as to the deterioration of the pattern-forming body itself because no photocatalyst is contained in the produced pattern-forming body.

In order to attain the above object, the present invention provides a process for the production of a pattern-forming body, the process comprising disposing a photocatalyst-containing layer-side substrate containing at least a photocatalyst-containing layer and a pattern-forming body substrate containing a characteristic-changeable layer which is changed in characteristics by the action of the photocatalyst contained in at least the photocatalyst-containing layer such that the photocatalyst-containing layer is in contact with the characteristic-changeable layer, followed by performing exposure to thereby change the characteristics of the exposed portion of the characteristic-changeable layer and thereafter dismounting the photocatalyst-containing layer-side substrate, thereby obtaining a pattern-forming body having a pattern which has been changed in characteristics on the characteristic-changeable layer.

As aforementioned, in the present invention, the photocatalyst-containing layer and the characteristic-changeable layer are disposed such that they are in contact with each other and thereafter the exposure is carried out to thereby change the characteristics of the exposed portion of the characteristic-changeable layer thereby forming a pattern. Therefore, no post-exposure treatment is needed and a pattern-forming body having a highly precise pattern can be produced. Also, since the photocatalyst-containing layer-side substrate is dismounted from the pattern-forming body after exposure, the photocatalyst-containing layer is not contained in the pattern-forming body itself and there is therefore no fear that the pattern-forming body is deteriorated with time by the action of the photocatalyst.

In the present invention, the photocatalyst-containing layer-side substrate comprises at least a transparent substrate and a photocatalyst-containing layer and may be formed separately from the pattern-forming body substrate. Also, the photocatalyst-containing layer-side substrate may be formed by coating the characteristic-changeable layer of the pattern-forming body substrate with a photocatalyst-containing layer.

In the case where the photocatalyst-containing layer-side substrate is formed as a body separated from the pattern-forming body substrate and comprises at least the photocatalyst-containing layer and the transparent substrate, this photocatalyst-containing layer-side substrate is brought into contact with the characteristic-changeable layer of the pattern-forming body substrate to carry out exposure to form a pattern on the characteristic-changeable layer by the action of the photocatalyst and then the photocatalyst-containing layer-side substrate is dismounted, whereby the photocatalyst-containing layer-side substrate can be used again. Namely, by allowing the photocatalyst-containing layer-side substrate to have such a structure, pattern-forming bodies can be produced fundamentally by using the photocatalyst-containing layer-side substrate repeatedly. This case therefore has an advantage when many pattern-forming bodies are formed at a time.

On the other hand, in the case where the photocatalyst-containing layer-side substrate is formed by coating the characteristic-changeable layer of the pattern-forming body substrate with the photocatalyst-containing layer, the photocatalyst-containing layer-side substrate can be easily formed by only coating the characteristic-changeable layer with the photocatalyst-containing layer. This case is therefore advantageous when the number of the patterned bodies to be produced is small. In the case where the photocatalyst-containing layer-side substrate is formed by coating the characteristic-changeable layer of the pattern-forming body substrate with the photocatalyst-containing layer in this manner, the dismounting of the photocatalyst-containing layer after exposure is carried out using, for instance, a method of peeling it using an adhesive tape.

In the case where the photocatalyst-containing layer-side substrate is formed separately from the pattern-forming body substrate and comprises at least the photocatalyst-containing layer and the transparent substrate, the photocatalyst-containing layer-side substrate may be formed such that it is integrated with a photomask. This is because, if the photomask is formed in advance on the photocatalyst-containing layer-side substrate, it is unnecessary to prepare the photomask separately and troublesome works, such as alignment with the photomask, which are conducted during exposure are eliminated.

Also, in the case where the photocatalyst-containing layer-side substrate is formed separately from the pattern-forming body substrate and comprises at least the photocatalyst-containing layer and the transparent substrate, the photocatalyst-containing later-side substrate may have a photocatalyst-containing layer which is formed pattern-wise on the transparent substrate. This case also has the advantage that no photomask is needed at the time of exposure. Also, because the photocatalyst-containing layer-side substrate is changed in characteristics only at the portion which is in contact with the pattern-forming body substrate at the time of exposure, light for exposure is not necessarily parallel light and even diffused light may also be used. This renders it possible to make the restriction on the light source to the minimum.

In the process for the production of a pattern-forming body according to the present invention, the photocatalyst to be contained in the photocatalyst-containing layer is preferably one or two or more types selected from titanium dioxide ($TiO_2$), zinc oxide (ZnO), tin oxide ($SnO_2$), strontium titanate ($SrTiO_3$), tungstenoxide ($WO_3$), bismuthoxide ($Bi_2O_3$) and iron oxide ($Fe_2O_3$). The photocatalyst is preferably titanium dioxide ($TiO_2$) among these oxides. This is because titanium dioxide is effective as the photocatalyst since it has a high bandgap energy, it is also chemically stable and nontoxic and it is also easily available.

In the present invention, the pattern-forming body substrate is preferably formed from at least a substrate and the aforementioned characteristic-changeable layer formed on the substrate. This is because the characteristic-changeable layer is preferably formed as a thin film on the substrate in view of strength, cost and function since the characteristic-changeable layer generally has various characteristics.

On the other hand, the above pattern-forming body substrate maybe formed only of one characteristic-changeable layer. This is because if it is a pattern-forming substrate having self-supportability, a particular base material is not needed.

Further, the characteristic-changeable layer in the present invention is preferably a wettability-changeable layer which is changed in surface wettability by the action of the photocatalyst contained in the photocatalyst-containing layer. The characteristics of the characteristic-changeable layer include various types and among these various characteristics, a change in wettability is exemplified as one of important characteristics. This reason is as follows. Specifically, the characteristic-changeable layer is designed to be a wettability-changeable layer in this manner, whereby a pattern changed in wettability by the action of the photocatalyst can be formed on the pattern-forming body. By sticking a composition for functional portions such as ink to the portion changed in wettability, various functional elements, for example, a color filter and a microlens can be formed as explained later.

In the present invention, the above wettability-changeable layer is preferably a wettability-changeable layer which is changed in wettability in a manner that the contact angle with water is lowered by exposure. This reason is as follows. Specifically, if such a wettability-changeable layer which is changed in wettability in a manner that the contact angle with water is decreased by exposure is formed, the wettability of this layer is easily changed by performing exposure or the like to enable the formation of an ink-philic region reduced in contact angle with water. For example, only the portion to which a composition for a functional portion is to be stuck can be made to be a ink-philic region with ease. Therefore, color filters, microlenses and the like can be produced in an efficient manner, which is economically advantageous.

In the present invention, the contact angle of the wettability-changeable layer with water is preferably 90 degrees or more in the unexposed portion and 30 degrees or less in the exposed portion. When the contact angle with water is 90 degrees or less, only insufficient ink-repellent ability is obtained because the unexposed portion is a portion where ink-repellency is needed and there is a possibility that a composition for a functional portion such as ink is left unremoved. Therefore, a contact angle out of the defined range is undesirable. Also, the reason why the contact angle of the exposed portion with water is 30 degrees or less is that when the contact angle exceeds 30 degrees, there is a possibility that a composition for functional portions such as ink is inferior in spreading at this portion, specifically, possibility is afforded for derivation of disadvantages such as the occurrence of color voids when the functional portion is, for example, a pixel portion of a color filter.

Also, this wettability-changeable layer is preferably a layer containing organopolysiloxane. This reason is explained below. Specifically, in the present invention, the characteristics required for the wettability-changeable layer are those that the wettability-changeable layer is ink-repellent when it is not irradiated with light and becomes ink-philic by the action of the photocatalyst in the photocatalyst-containing layer when it is irradiated with light. As a material imparting such characteristics to the wettability-changeable layer, organopolysiloxane is first exemplified.

Among the organopolysiloxanes, those which are hydrolytic condensates or hydrolytic cocondensates of one or two or more silicon compounds represented by $Y_nSiX_{(4-n)}$ (wherein Y represents an alkyl group, a fluoroalkyl group, a vinyl group, an amino group, a phenyl group or an epoxy group, X represents an alkoxyl group or a halogen and n denotes an integer of 0 to 3) are preferable. This is because such organopolysiloxanes satisfy the requirements for the above characteristics.

Also, in the present invention, the above organopolysiloxane is preferably those containing a fluoroalkyl group. This polysiloxane containing a fluoroalkyl group can exhibit very high water-repellency and oil-repellency at the non-irradiated portion.

In the present invention, the above characteristic-changeable layer may be a decomposition-removable layer which is decomposed and removed by the action of the photocatalyst contained in the photocatalyst-containing layer. This reason is as follows. By designing the characteristic-changeable layer to be the decomposition-removable layer which can be decomposed and removed by the action of the photocatalyst in the photocatalyst-containing layer in this manner, the exposed portion is decomposed and removed by the action of the photocatalyst resultantly. The portion irradiated with light is decomposed and removed completely in this manner without, particularly, a necessity of post-treatment. For this, this structure may be used in various applications in which, for example, the decomposition-removable layer is made of a photoresist and the photocatalyst-containing layer-side substrate is brought into contact with the photoresist to perform exposure, whereby a pattern can be formed on the photoresist without a necessity of performing the developing process which is conventionally carried out.

In this case, it is preferable that the decomposition-removable layer be different in contact angle with water from exposed members to be exposed when the decomposition-removable layer is decomposed and removed.

If the decomposition-removable layer and the exposed members to be exposed when the decomposition-removable layer is decomposed and removed are different from each other in contact angle with water in this manner, the decomposition-removable layer in the exposed portion is decomposed and removed by the action of the photocatalyst and the exposed member is eventually exposed from the surface. On the other hand, in the unexposed portion, the decomposition-removable layer is left unremoved. Here, in the case where the decomposition-removable layer and the exposed members are different from each other in contact angle with water, for example, in the case where the decomposition-removable layer is formed of an ink-repellent material and the exposed member is formed of an ink-philic material, a portion where a functional portion is to be formed is irradiated with light in advance to make the photocatalyst work whereby the decomposition-removable layer in this portion can be removed with the result that the exposed portion is made to be a concave portion and an ink-philic region and the unexposed portion is made to be a convex portion and an ink-repellent region. This ensures that a composition for functional portions can be stuck easily with high accuracy to the concave and ink-philic region where this functional portion is to be formed. Therefore, the functional portion can be formed more accurately than in the case where the aforementioned characteristic-changeable layer is the wettability-changeable layer. Also, it is unnecessary to carry out post-exposure treatments such as a developing process and a washing process. For this, the process can be simplified easily and as a result, a functional element which is inexpensive and has precise functional portion can be obtained.

Also, it is desirable that the contact angle of the decomposition-removable layer with water be 60 degrees or more and the contact angle, with water, of the surface of the exposed member which is exposed when the decomposition-removable layer is decomposed and removed be 30 degrees or less.

In the present invention, the decomposition-removable layer in the unexposed portion is left unremoved. Here, generally, the unexposed portion is a portion where ink-repellency is required. Therefore, when the contact angle of the decomposition-removable layer with water is smaller than 60 degrees, only insufficient ink-repellency is obtained and there is a possibility that a composition for functional portions is left unremoved. So, such a contact angle out of the defined range is undesirable.

On the other hand, the exposed portion is decomposed and removed by the action of the photocatalyst in the photocatalyst-containing layer which is in contact with the decomposition-removable layer. Therefore, in the exposed portion, the exposed member formed under the decomposition-removable layer is eventually exposed from the surface. This portion is a portion for which ink-philic characteristics are usually required. Therefore, when the contact angle of the exposed member with water exceeds 30 degrees, there is a possibility that a composition for functional portions such as ink is inferior in spreading at the function portion and possibility is afforded for occurrence of voids of the composition for functional portions.

As aforementioned, it is preferable that the decomposition-removable layer be decomposed and removed by the photocatalyst in the photocatalyst-containing layer which is in contact with the decomposition-removable layer and have ink-repellency. Therefore, the decomposition-removable layer preferably comprises hydrocarbon type, fluorine type or silicone type nonionic surfactant.

A pattern exposure method in the present invention may be a method using a photomask or a method using light drawing irradiation and is properly selected according to the qualities and applications of the resulting pattern-forming body. Also, the exposure is preferably carried out while the photocatalyst-containing layer is heated as described. This is because the exposure of the photocatalyst-containing layer under heat allows the photocatalyst in the photocatalyst-containing layer to act on the characteristic-changeable layer highly sensibly.

In order to solve the aforementioned problem, the present invention further provides a photocatalyst-containing layer-side substrate for the production of a pattern-forming body, the substrate comprising at least a transparent substrate and a photocatalyst-containing layer, wherein a characteristic-changeable layer of a pattern-forming substrate having the characteristic-changeable layer which is changed in characteristics by the action of the photocatalyst on the surface thereof and the photocatalyst-containing layer are exposed while the both layers are being in contact with each other to form a pattern-forming body.

As aforementioned, the photocatalyst-containing layer-side substrate for the production of a pattern-forming body according to the present invention ensures that a pattern can be formed on the pattern-forming body by exposing the photocatalyst-containing layer while the photocatalyst-containing layer is in contact with the characteristic-changeable layer of the pattern-forming substrate. Therefore, the photocatalyst-containing layer-side substrate for the production of a pattern-forming body according to the present invention has the advantage that it can be repeatedly used basically by dismounting it from the characteristic-changeable layer after exposed. In this case, the photocatalyst contained in the photocatalyst-containing layer is preferably titanium dioxide. This is because titanium dioxide is effective as the photocatalyst since it has a high bandgap energy, it is also chemically stable and nontoxic and it is also easily available.

The above photocatalyst-containing layer-side substrate for the production of a pattern-forming body may be formed such that it is integrated with a photomask and may also have a photocatalyst-containing layer formed pattern-wise on a transparent substrate. These reasons are as aforementioned.

In order to solve the above problem, the present invention also provides a pattern-forming body comprising at least a substrate and a characteristic-changeable layer which is formed on the substrate and has a pattern which has been changed in characteristics by the action of a photocatalyst and having no photocatalyst-containing layer.

As aforementioned, the pattern-forming body of the present invention comprises at least the substrate and the characteristic-changeable layer having the pattern which has been changed in characteristics by the action of the photocatalyst. Therefore, when the change in characteristics is, for example, a change in wettability, this pattern-forming body may be utilized as various printing master plates making use of a difference in the acceptability of ink and is therefore made into various inexpensive printing master plates which need not to perform, for example, developing and washing process when they are produced. Also, since this pattern-forming body does not comprise a photocatalyst-containing layer, it has an advantage that there is no fear that the pattern-forming body is deteriorated with time by the action of the photocatalyst.

In the present invention, the characteristic-changeable layer is preferably a wettability-changeable layer which is to be changed in wettability by the action of the photocatalyst under exposure such that the contact angle with water is lowered.

If the characteristic-changeable layer is the wettability-changeable layer which is to be changed in wettability by the action of the photocatalyst under exposure such that the contact angle with water is lowered as aforementioned, the wettability is easily changed by performing exposure to form a pattern-forming body having a pattern of an ink-philic region having a small contact angle with water. By sticking a composition for functional portions to the pattern of the ink-philic region of the pattern-forming body, functional elements such as color filters and microlenses can be formed efficiently, presenting a cost advantage.

Also, it is preferable that the characteristic-changeable layer is a decomposition-removable layer which is decomposed and removed by the action of the photocatalyst and the decomposition-removable layer is different in contact angle with water from the exposed member which is exposed when the decomposition-removable layer is decomposed and removed.

As aforementioned, the pattern-forming body is made to have a structure in which the characteristic-changeable layer is a decomposition-removable layer which is decomposed and removed by the action of the photocatalyst and the decomposition-removable layer is different in contact angle with water from the exposed member which is exposed when the decomposition-removable layer is decomposed and removed, whereby a pattern-forming body can be obtained in which the portion where the functional portion is to be formed is made to be an ink-philic region such that the contact angle of the portion with water which contact angle indicates the wettability of the portion is made small in advance and the other portions are made to be an ink-repellent region having a large contact angle with water. By sticking a composition for functional portions to the pattern of the ink-philic region of the pattern-forming body, the composition for functional portions can be stuck easily only to the ink-philic region having a small contact angle with water. Therefore, in the same manner as in the aforementioned case where the characteristic-changeable layer is the wettability-changeable layer, functional elements can be formed easily from the pattern-forming body without performing post-exposure treatments such as a developing process and a washing process. For this, the process can be simplified with ease and functional elements having functional portions can be obtained at low costs.

In the present invention, functional portions are disposed at the sections corresponding to the pattern formed on the aforementioned pattern-forming body, whereby a functional element can be made. The use of the pattern-forming body of the present invention makes it possible to obtain functional elements with ease in this manner. At this time, the functional portion may be a metal. In this case, these functional elements may be used as metal circuits or the like.

In this case, the functional element preferably has a structure in which the pattern is a pattern formed of sections differing in contact angle with water and the functional portions are formed on sections having a small contact angle with water in this pattern. This is because, as aforementioned, functional elements can be formed with ease by allowing a composition for functional portions to adhere to the ink-philic region having a small contact angle with water and therefore these functional elements are advantageous in view of cost.

The functional element of the present invention may be made as a color filter by using the functional portion as a pixel portion and as a microlens by using the functional portion as a lens. This is because the advantage of the present invention can be utilized sufficiently when the functional element of the present invention is used as the color filter and microlens.

BRIEF DESCRIPTION OF THE DRAWINGS

FIG. 1(A) to FIG. 1(C) and FIG. 1(C') are typical sectional views showing one example of a process for the production of a pattern-forming body according to the present invention.

FIG. 2(A) to FIG. 2(D) and FIG. 2(D') are typical sectional views showing another example of a process for the production of a pattern-forming body according to the present invention.

DESCRIPTION OF THE PREFERRED EMBODIMENT

Figure 1A:
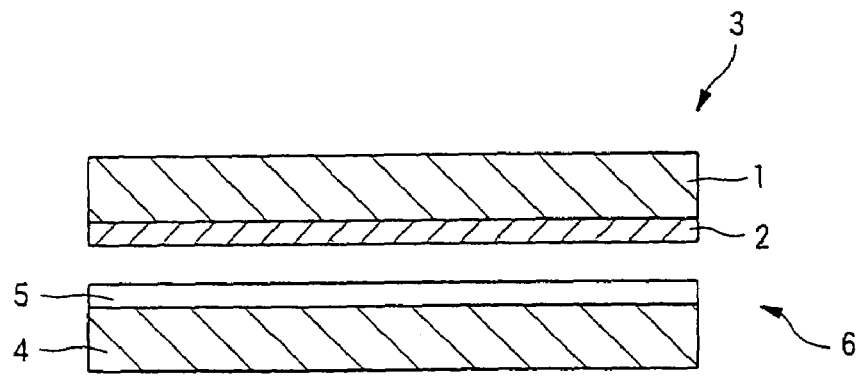

A process for the production of a pattern-forming body according to the present invention will be hereinafter explained in detail. The process for the production of a pattern-forming body according to the present invention comprises disposing a catalyst-containing layer-side substrate containing at least a photocatalyst-containing layer and a pattern-forming body substrate containing a characteristic-changeable layer which is changed in characteristics by the action of the photocatalyst in at least the photocatalyst-containing layer such that the photocatalyst-containing layer is in contact with the characteristic-changeable layer, followed by performing exposure to thereby change the characteristics of the exposed portion of the characteristic-changeable layer and thereafter dismounting the photocatalyst-containing layer-side substrate, thereby obtaining a pattern-forming body having a pattern which has been changed in characteristics on the characteristic-changeable layer.

As aforementioned, in the process for the production of a pattern-forming body according to the present invention, the photocatalyst-containing layer and the characteristic-changeable layer are disposed such that they are in contact with each other and thereafter the exposure is carried out to thereby change the characteristics of the exposed portion of the characteristic-changeable layer by the action of the photocatalyst, thereby forming a pattern made of the exposed portion on the characteristic-changeable layer, namely, the portion changed in characteristics. Therefore, post-exposure treatments such as developing and washing are not needed and therefore a pattern can be formed using processs smaller in number than those in a conventional process at low costs. Accordingly, functional elements such as a color filter can be formed easily at low costs by forming functional portions along the pattern of the pattern-forming body.

Further, in the present invention, after the characteristics of the characteristic-changeable layer are changed by the action of the photocatalyst contained in the photocatalyst-containing layer, the photocatalyst-containing layer-side substrate is dismounted to prepare the pattern-forming body-side substrate as a pattern-forming body and therefore no photocatalyst-containing layer is contained in the resulting pattern-forming body. Therefore, when a functional portion is formed in the pattern-forming body to be obtained to form a functional element, no photocatalyst-containing layer is contained in the inside of the functional element and therefore, possibilities that the functional element is deteriorated with time by the action of the photocatalyst can be eliminated entirely.

The process of the formation of a pattern-forming body according to the present invention as aforementioned will be explained with reference to the drawings. The pattern in the present invention represents various patterns such as designs, images, circuits and characters and no particular limitation is imposed on the pattern.

FIG. 1 shows an example of the process for the production a pattern-forming body according to the present invention. In this production process, first a photocatalyst-containing layer-side substrate 3 consisting of a transparent substrate 1 and a photocatalyst-containing layer 2 formed on the transparent substrate 1 and a pattern-forming body substrate 6 consisting of a substrate 4 and a characteristic-changeable layer 5 formed on the substrate 4 are prepared (see FIG. 1(A)).

Next, the photocatalyst-containing layer 2 of the photocatalyst-containing layer-side substrate 3 is stuck to the characteristic-changeable layer 5 of the pattern-forming body substrate 6 such that the both layers are in contact with each other and exposed to light, for example, UV light through a photomask 7. The characteristics of the exposed section on the characteristic-changeable layer 5 are changed and the exposed section is converted into a characteristic-changeable section 8 (see FIG. 1(B)).

Figure 1B:
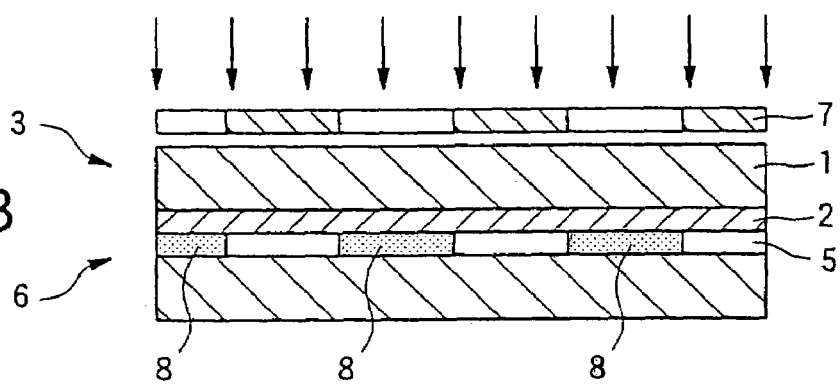
Figure 1C:
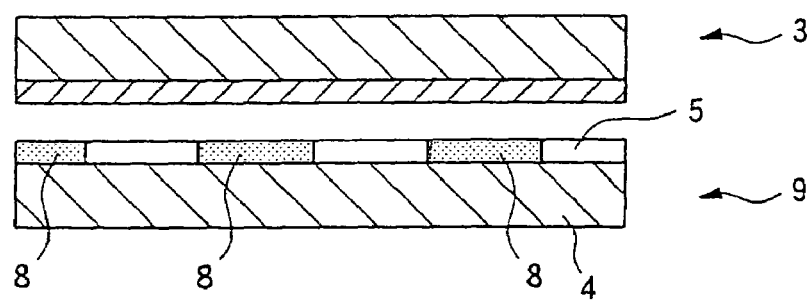
Figure 1C:
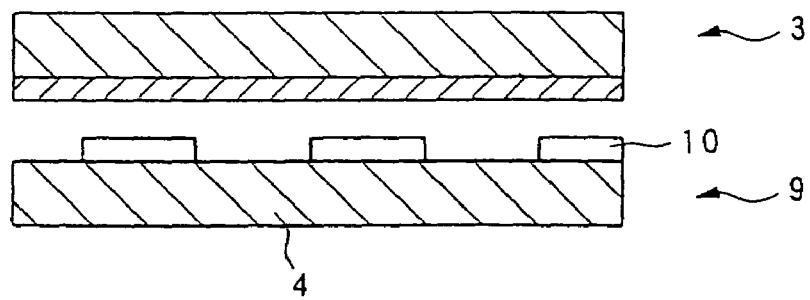

Next, the photocatalyst-containing layer-side substrate 3 is dismounted (separated) from the pattern-forming body substrate to thereby form a pattern-forming body 9 in which the pattern of the characteristic-changeable section 8 is formed (see FIG. 1(C)).

Also, another example of the process of the production of a pattern-forming body according to the present invention is shown in FIG. 2. In this example, first a pattern-forming body substrate 6 in which a characteristic-changeable layer 5 is formed on a substrate 4 is prepared (see FIG. 2(A)). Next, a photocatalyst-containing layer 2 is formed on this characteristic-changeable layer by application or the like (see FIG. 2(B)). In this example, the photo-catalyst-containing layer 2 formed by application or the like becomes the photocatalyst-containing layer-side substrate 3. Then, the substrate 3 is exposed to light through a photomask 7 in the same manner as in the above example 1 to thereby form a characteristic-changeable section 8 on the characteristic-changeable layer 5 (see FIG. 2(C)). Finally, the photocatalyst-containing layer 2 is dismounted to obtain a pattern-forming body 9 in which the pattern of the characteristic-changeable section 8 has been formed on the characteristic-changeable layer 5 (see FIG. 2(D)).

The process for the production of a pattern-forming body according to the present invention will be hereinafter explained in detail taking the aforementioned two production processes as examples.

(Photocatalyst-containing Layer-side Substrate)

In the present invention, the photocatalyst-containing layer-side substrate includes any substrate as far as it contains at least a photocatalyst-containing layer. For example, the photocatalyst-containing layer-side substrate may be those containing a transparent substrate 1 besides the photocatalyst-containing layer 2 as shown by the example of FIG. 1 or those formed of a single photocatalyst-containing layer 2 as shown by the example of FIG. 2. Also, the photocatalyst-containing layer-side substrate may be those provided with other layers according to the need.

Also, this photocatalyst-containing layer-side substrate is obtained by forming the photocatalyst-containing layer 2 on the transparent substrate 1 as shown by the example of FIG. 1 and may be a substrate formed separately from the pattern-forming body substrate in advance or a substrate formed such that it is integrated with the pattern-forming body substrate such as the photocatalyst-containing layer-side substrate obtained by forming the photocatalyst-containing layer 2 by application as shown by the example of FIG. 2.

If, as shown in FIG. 1, the photocatalyst-containing layer-side substrate 3 is formed separately from the pattern-forming body substrate 6, the photocatalyst-containing layer-side substrate 3 can be used again by dismounting the photocatalyst-containing layer-side substrate 3 after the characteristic-changeable layer of the pattern-forming body substrate 6 and the photocatalyst-containing layer-side substrate 3 are exposed to light in a manner that the both layers are in contact with each other to form a pattern on the characteristic-changeable layer 5 by the action of the photocatalyst as shown in FIG. 1(A) to (C). Specifically, the photocatalyst-containing layer-side substrate can be repeatedly used fundamentally by allowing the photocatalyst-containing layer-side substrate to have such a structure, presenting an advantage when many pattern-forming bodies are produced.

In the case of forming the photocatalyst-containing layer-side substrate separately from the pattern-forming body substrate, it is preferable to contain at least a transparent substrate other than the photocatalyst-containing layer in light of strength, cost and the like. Specifically, such a structure in which the photocatalyst-containing layer 2 is formed on the transparent substrate 1 as shown in FIG. 1 makes it possible to have strength sufficient to stand against repeated use and is more advantageous in cost than in the case where only the photocatalyst-containing layer 2 is formed separately.

Such a photocatalyst-containing layer-side substrate may have any structure as far as it has at least a photocatalyst-containing layer and a transparent substrate and is provided with an exposed portion on one surface. For example, other than the above, a photomask may be formed such that it is integrated with the substrate or a protective layer may be formed on the periphery. Also, in FIG. 1(B), a contact-inhibitive layer is formed mask-pattern-wise on the photocatalyst-containing layer to limit the portion, which is in contact with the characteristic-changeable layer, pattern-wise so that a characteristic-changeable section can be formed pattern-wise on the characteristic-changeable layer even if the entire surface of the characteristic-changeable layer is exposed to light. Also, the photocatalyst-containing layer itself may be formed pattern-wise.

To specifically state the case where the photomask is formed in an integrated form, a photomask with the shading portion formed pattern-wise is formed such that it is integrated with the photocatalyst-containing layer-side substrate. The position of the photomask in this case may be any position of the photocatalyst-containing layer-side substrate as far as it allows pattern exposure on the pattern-forming body substrate to be performed properly by carrying out exposure from any side of the photocatalyst-containing layer-side substrate. The integration of the photomask has the advantage that the alignment of the photomask is not required at the time of exposure in addition to the advantage that it is unnecessary to prepare any photomask separately.

Also, those prepared by forming the photocatalyst-containing layer itself pattern-wise are those, for example, having a photocatalyst-containing layer patterned by a photolithographic method or the like after the photocatalyst-containing layer is applied to the entire surface of a transparent substrate. Such a structure in which the photocatalyst-containing layer is formed pattern-wise on the transparent substrate in this manner has the advantage that it is unnecessary to use parallel light when the above exposure is carried out besides the advantage that it is unnecessary to use a photomask at the time of exposure. Therefore, it is possible to widen a space for the selection of an exposure light source.

On the other hand, as shown in FIG. 2, when the photocatalyst-containing layer-side substrate is made in the form integrated with the pattern-forming body substrate 6 by applying the photocatalyst-containing layer to the pattern-forming body substrate 6, no strength is required for the photocatalyst-containing layer-side substrate and therefore a layer for keeping strength is not needed, which is advantageous when a small number of pattern-forming bodies is prepared.

In this case, also, any other layers may be formed as far as at least the photocatalyst-containing layer is contained. For example, an adhesive layer may be disposed in advance to make it easy to dismount the photocatalyst-containing layer-side substrate. Also, this photocatalyst-containing layer may be formed pattern-wise.

(Photocatalyst-containing Layer)

As aforementioned, the photocatalyst-containing layer-side substrate 3 contains at least the photocatalyst-containing layer 2.

There is no particular limitation to the photocatalyst-containing layer as far as it has a structure in which the photocatalyst contained therein changes the characteristics of the characteristic-changeable layer which is in contact with the photocatalyst-containing layer. The photocatalyst-containing layer may be those structured of a photocatalyst and a binder or those prepared by forming a film of a single photocatalyst. Also, as to the wettability of the surface of the photocatalyst-containing layer, the surface may be either ink-philic or ink-repellent.

Although the working mechanism of the photocatalyst represented by titanium dioxide as will be explained later is not entirely clear, it is generally considered that carriers generated by the radiation of light reacts directly with neighboring compounds or combines with active oxygen analogues produced in the presence of oxygen and water to exert an influence on the change of the chemical structures of organic compounds. It is considered that in the present invention, this carrier acts on the compounds contained in the characteristic-changeable layer which is in contact with the photocatalyst-containing layer.

Examples of the photocatalyst to be used in the present invention may include those known as photo-semiconductors such as titanium dioxide ($TiO_2$), zinc oxide (ZnO), tin oxide ($SnO_2$), strontium titanate ($SrTiO_3$), tungsten oxide ($WO_3$), bismuth oxide ($Bi_2O_3$) and iron oxide ($Fe_2O_3$). One or two or more types selected from these compounds may be mixed and used.

In the present invention, particularly titanium dioxide ($TiO_2$) is preferably used since it has a high bandgap energy, it is chemically stable and nontoxic and it is also easily available. Titanium dioxide includes an anatase type and a rutile type and any one of these types may be used in the present invention. However, anatase type titanium dioxide is preferable. The exciting wavelength of anatase type titanium dioxide is present at 380 nm or less.

Examples of such anatase type titanium dioxide include hydrochloric acid-deswelling anatase type titania sol (STS-02 (average particle diameter: 7 nm), manufactured by Ishihara Sangyo Kaisha, Ltd.) and (ST-K01, manufactured by Ishihara Sangyo Kaisha, Ltd.) and nitric acid-deswelling anatase type titania sol (TA-15 (average particle diameter: 12 nm), manufactured by Nissan Chemical Industries, Ltd.).

A smaller particle diameter of the photocatalyst is more preferable because a photocatalyst reaction is caused efficiently. An average particle diameter of 50 nm or less is preferable and the use of a photocatalyst having an average particle diameter of 20 nm or less is particularly preferable.

The photocatalyst-containing layer in the present invention may be those formed of a single photocatalyst or those formed by mixing a photocatalyst with a binder.

Examples of a method used when the photocatalyst-containing layer is formed of a single photocatalyst in the case of using titanium dioxide include a method in which amorphous titania is formed on a transparent substrate or a characteristic-changeable layer and is then phase-converted into a crystalline titania by calcination. The above amorphous titania used here may be obtained, for example, by the hydrolysis and dehydration condensation of inorganic salts of titanium such as titanium tetrachloride or titanium sulfate or by the hydrolysis and dehydration condensation of organic titanium compounds such as tetraethoxytitanium, tetraisopropoxytitanium, tetra-n-propoxytitanium, tetrabutoxytitanium or tetramethoxytitanium in the presence of an acid. Then, the obtained amorphous titania can be denatured into anatase type titania by calcination at 400° C. to 500° C. and into rutile type titania by calcination at 600° C. to 700° C.

Also, in the case of using a binder, binders having such a high binding energy as to prevent the major skeleton of the binder from being decomposed by light excitation of the aforementioned photocatalyst are preferable. Examples of such a binder include organopolysiloxane which will be explained in detail in the paragraph for explaining the wettability-changeable layer as described later.

When organopolysiloxane is used as the binder in this manner, the above photocatalyst-containing layer may be formed by dispersing a photocatalyst, organopolysiloxane as the binder and, as required, other additives in a solvent to prepare a coating solution and by coating on the transparent substrate or on the characteristic-changeable layer with the coating solution. As the solvent to be used, alcoholic organic solvents such as ethanol and isopropanol are desirable. The coating may be carried out using known coating methods such as spin coating, spray coating, dip coating, roll coating and beads coating. When a ultraviolet-curable component is contained as the binder, ultraviolet rays are applied to perform hardening treatment whereby photocatalyst-containing layer may be formed.

Also, an amorphous silica precursor may be used as the binder. This amorphous silica precursor is preferably silicon compounds represented by the formula $SiX_4$, wherein X is a halogen, a methoxy group, an ethoxy group or an acetyl group, silanol which is dehydrates of these silicon compounds and polysiloxane having an average molecular weight of 3000 or less.

Specific examples include tetraethoxysilane, tetraisopropoxysilane, tetra-n-propoxysilane, tetrabutoxysilane and tetramethoxysilane. In this case, the amorphous silica precursor and photocatalyst particles are uniformly dispersed in a non-aqueous solvent and the amorphous silica precursor is hydrolyzed by water in air to form silanol on a transparent substrate. The resulting silanol is then dehydrated and condensation-polymerized at ambient temperature, whereby the photocatalyst-containing layer can be formed. If the dehydration and condensation-polymerization of silanol are carried out at 100° C. or more, the degree of polymerization of silanol is increased, making it possible to improve the strength of the film surface. These binding agents maybe used either singly or by mixing two or more.

The content of the photocatalyst contained in the photocatalyst-containing layer is designed to be in a range from 5 to 60% by weight and preferably 20 to 40% by weight. The thickness of the photocatalyst-containing layer is preferably in a range from 0.05 to 10 μm.

Also, the photocatalyst-containing layer may contain a surfactant besides the aforementioned photocatalyst and binder. Specific examples of the surfactant include nonionic surfactants such as hydrocarbon type surfactants, e.g., each series of NIKKOL BL, BC, BO and BB manufactured by Nikko Chemicals and fluorine type or silicone type nonionic surfactants, e.g., ZONYL, FSN and FSO manufactured by DuPont, Sarfron S-141 and 145 manufactured by Asahi Glass, Megafac F-141 and 144 manufactured by Dainippon Ink & Chemicals Inc., Ftergent F-200 and F251 manufactured by Neosu, Unidine DS-401 and 402 manufactured by Daikin Industries and Flowlad FC-170 and 176 manufactured by 3 M. Also, cationic surfactants, anionic surfactants and amphoteric surfactants may be used.

Further, the photocatalyst-containing layer may contain, besides the above surfactant, oligomers or polymers such as polyvinyl alcohol, unsaturated polyester, acrylic resins, polyethylene, diallyl phthalate, ethylenepropylenediene monomers, epoxy resins, phenol resins, polyurethane, melamine resins, polycarbonate, polyvinyl chloride, polyamide, polyimide, styrene-butadiene rubber, chloroprene rubber, polypropylene, polybutylene, polystyrene, polyvinyl acetate, polyester, polybutadiene, polybenzimidazole, polyacrylnitrile, epichlorohydrin, polysulfide and polyisoprene.

(Transparent Substrate)

In the present invention, as shown in FIG. 1, the photocatalyst-containing layer-side substrate 3 preferably comprises the transparent substrate 1 and the photocatalyst-containing layer 2 formed on the transparent substrate 1.

No particular limitation is imposed on this transparent substrate as far as it is a material which transmits light such as UV light so as to enable exposure from the side of the photocatalyst-containing layer-side substrate on which side the photocatalyst-containing layer 2 is not formed when exposure is performed as shown in FIG. 1(B). Preferable examples of transparent substrate materials include non-flexible transparent rigid materials such as quarts glass, Pyrex® glass and synthetic quartz plates and flexible transparent materials such as transparent resin films and optical resin plates.

(Pattern-forming Body Substrate)

In the process for the production of a pattern-forming body according to the present invention, as shown in FIG. 1 and FIG. 2, first the aforementioned photocatalyst-containing layer-side substrate 3 and the pattern-forming body substrate 6 are prepared.

No particular limitation is imposed on the pattern-forming body substrate as far as it has at least a characteristic-changeable layer. To state in more detail, the pattern-forming body substrate may be formed only of one characteristic-changeable layer if the characteristic-changeable layer has self-supporting ability or may be a type provided with the characteristic-changeable layer formed on a substrate in light of strength. Also, in addition, another protective layer or the like may be formed according to the need. However, it is necessary that the characteristic-changeable layer is exposed from all or a part of the surface.

In the present invention, the pattern-forming body substrate shows the substrate put in the condition that any pattern made of characteristic-changeable sections has not been formed yet on the characteristic-changeable layer and one in which a pattern of the characteristic-changeable sections is formed on the characteristic-changeable layer by exposing this pattern-forming body substrate to light is referred to as the pattern-forming body.

(Characteristic-changeable Layer)

Any layer may be used as the characteristic-changeable layer in the present invention as far as it is changed in characteristics by the action of the photocatalyst. For example, the characteristic-changeable layer may be a layer which is colored by the action of the photocatalyst by mixing a photochromic material such as spiropyran or by mixing an organic dye or the like which is decomposed by the action of the photocatalyst in the characteristic-changeable layer.

Also, as the characteristic-changeable layer, a layer maybe used which is improved in adhesion to various materials by using a polymer material such as a polyolefin, e.g., polyethylene or polypropylene, to introduce a polar group into the exposed portion and to place the surface in rough condition by the action of the photocatalyst. If such an adhesion-changeable layer which is changed in adhesion is used as the characteristic-changeable layer in this manner, a highly adhesive pattern can be formed by pattern exposure. The pattern-forming body having a pattern of such a highly adhesive section ensures that, for example, a metal thin film pattern can be formed by depositing a metal component on the pattern-forming body to form a metal thin film and then peeling off the metal thin film by using, for example, adhesives or chemicals by making use of a difference in adhesion. According to this method, a metal thin film pattern can be formed without forming any resist pattern and therefore print boards, electronic circuit elements and the like having a more highly precise pattern than those produced by a printing method can be formed.

As aforementioned, there is no particular limitation to the characteristic-changeable layer insofar as it is a layer having various characteristics which are changed by the action of the photocatalyst. However, in the present invention, the following two cases are preferable among the aforementioned various characteristic-changeable layers because in these two cases, the effectiveness of the present invention is drawn out more greatly in relation to, particularly, the resulting functional elements. Specifically, in one case, the characteristic-changeable layer is a wettability-changeable layer which is changed in wettability by the action of the photocatalyst to form a pattern of wettabilities and in another case, the characteristic-changeable layer is a decomposition-removable layer which is decomposed and removed by the action of the photocatalyst to form a pattern of irregularities.

(Wettability-changeable Layer)

The wettability-changeable layer meant in the present invention is a layer which is changed in the wettability of the surface by the action of the photocatalyst during exposure to enable the formation of a pattern of the sections differing in wettability. This wettability-changeable layer is preferably a layer which is changed in wettability by exposure such that it is reduced in contact angle with water, though no particular limitation is imposed on the wettability-changeable layer.

As aforementioned, the wettability-changeable layer is made to have such a structure in which it is changed in wettability by exposure such that the contact angle with water is decreased. This structure ensures that the wettability is easily changed by performing pattern exposure with the result that a pattern of ink-philic regions reduced in contact angle with water can be formed. Accordingly, for example, only the sections where functional portions are to be formed on the wettability-changeable layer are exposed to thereby change the sections to ink-philic regions, easily. So a functional element can be formed with ease by sticking a composition for functional portions to the portion. Thus, functional elements can be produced efficiently, which is advantageous in view of cost.

Here, the ink-philic region device a region which has a small contact angle with water and exhibits high wettability to a composition for functional portions, for example, coloring ink and compositions for the formation of microlenses. Also, the ink-repellent region device a region which has a large contact angle with water and exhibits low wettability to coloring ink and compositions for the formation of microlenses.

The contact angle of the aforementioned wettability-changeable layer with water is 90 degrees or more and preferably 140 degrees or more at the unexposed portion. This reason is that when the contact angle with water is 90 degrees or less, only insufficient ink-repellency is obtained and the possibility that a composition for functional portions, such as coloring ink, is left unremoved arises, because the unexposed portion is a portion for which ink-repellency is required in the present invention.

Also, the above wettability-changeable layer is preferably a layer which is decreased in contact angle with water to 30 degrees or less and preferably 20 degrees or less when exposed. The reason why the contact angle of the exposed portion with water is designed to be 30 degrees or less is that when the contact angle exceeds 30 degrees, there is a possibility that a composition for functional portions such as coloring ink is inferior in spreading at this portion and possibility is afforded for occurrence of defects of functional portions.

The contact angle with water-meant here is indicated by a value measured using a contact angle-measuring meter (CA-Z type, manufactured by Kyowa Kaimen Kagaku) 30 seconds after water droplets are dropped from a microsyringe.

There is no particular limitation to a material used for the wettability-changeable layer as far as it has the aforementioned characteristics relating to wettability, specifically it is a material which is changed in wettability by the photocatalyst contained in the photocatalyst-containing layer which is in contact with the wettability-changeable layer when it is exposed, and has a primary chain which is resistant to deterioration and decomposition caused by the action of the photocatalyst. Examples of the material include (1) Organopolysiloxane which is obtained by hydrolysis and polymerization-condensation of chloro or alkoxysilane by a sol-gel reaction or the like and (2) organopolysiloxane such as those obtained by crosslinking high water-repellent or oil-repellent silicone. These organopolysiloxanes preferably have a fluoroalkyl group.

In the case of the above (1), organopolysiloxanes which are hydrolyzed condensates or hydrolyzed co-condensates of one or two or more silicon compounds represented by the formula:

wherein Y represents an alkyl group, a fluoroalkyl group, a vinyl group, an amino group, a phenyl group or an epoxy group, X represents an alkoxyl group, acetyl group or a halogen and n denotes an integer of 0 to 3. Here, the number of carbons of the group represented by Y is preferably in a range from 1 to 20 and the alkoxy group represented by X is preferably a methoxy group, ethoxy group, propoxy group or butoxy group.

Examples of the alkoxy group which may be used include methyltrichlorosilane, methyltribromosilane, methyltrimethoxysilane, methyltriethoxysilane, methyltriisopropoxysilane, methyltri-t-butoxysilane; ethyltrichlorosilane, ethyltribromosilane, ethyltrimethoxysilane, ethyltriethoxysilane, ethyltriisopropoxysilane, ethyltri-t-butoxysilane; n-propyltrichlorosilane, n-propyltribromosilane, n-propyltrimethoxysilane, n-propyltriethoxysilane, n-propyltriisopropoxysilane, n-propyltri-t-butoxysilane; n-hexyltrichlorosilane, n-hexyltribromosilane, n-hexyltrimethoxysilane, n-hexyltriethoxysilane, n-hexyltriisopropoxysilane, n-hexyltri-t-butoxysilane; n-decyltrichlorosilane, n-decyltribromosilane, n-decyltrimethoxysilane, n-decyltriethoxysilane, n-decyltriisopropoxysilane, n-decyltri-t-butoxysilane; n-octadecyltrichlorosilane, n-octadecyltribromosilane, n-octadecyltrimethoxysilane, n-octadecyltriethoxysilane, n-octadecyltriisopropoxysilane, n-octadecyltri-t-butoxysilane; phenyltrichlorosilane, phenyltribromosilane, phenyltrimethoxysilane, phenyltriethoxysilarie, phenyltriisopropoxysilane, phenyltri-t-butoxysilane; tetrachlorosilane, tetrabromosilane, tetramethoxysilane, tetraethoxysilane, tetrabutoxysilane, dimethoxydiethoxysilane; dimethyldichlorosilane, dimethyldibromosilane, dimethyldimethoxysilane, dimethyldiethoxysilane; diphenyldichlorosilane, diphenyldibromosilane, diphenyldimethoxysilane, diphenyldiethoxysilane; phenylmethyldichlorosilane, phenylmethyldibromosilane, phenylmethyldimethoxysilane, phenylmethyldiethoxysilane; trichlorohydrosilane, tribromohydrosilane, trimethoxyhydrosilane, triethoxyhydrosilane, triisopropoxyhydrosilane, tri-t-butoxyhydrosilane; vinyltrichlorosilane, vinyltribromosilane, vinyltrimethoxysilane, vinyltriethoxysilane, vinyltriisopropoxysilane, vinyltri-t-butoxysilane; trifluoropropyltrichlorosilane, trifluoropropyltribromosilane, trifluoropropyltrimethoxysilane, trifluoropropyltriethoxysilane, trifluoropropyltriisopropoxysilane, trifluoropropyltri-t-butoxysilane; γ-glycidoxypropylmethyldimethoxysilane, γ-glycidoxypropylmethyldiethoxysilane, γ-glycidoxypropyltrimethoxysilane, γ-glycidoxypropyltriethoxysilane, γ-glycidoxypropyltriisopropoxysilane, γ-glycidoxypropyltri-t-butoxysilane; γ-methacryloxypropylmethyldimethoxysilane, γ-methacryloxypropylmethyldiethoxysilane, γ-methacryloxypropyltrimethoxysilane, γ-methacryloxypropyltriethoxysilane, γ-methacryloxypropyltriisopropoxysilane, γ-methacryloxypropyltri-t-butoxysilane; γ-aminopropylmethyldimethoxysilane, γ-aminopropylmethyldiethoxysilane, γ-aminopropyltrimethoxysilane, γ-aminopropyltriethoxysilane, γ-aminopropyltriisopropoxysilane, γ-aminopropyltri-t-butoxysilane; γ-mercaptopropylmethyldimethoxysilane, γ-mercaptopropylmethyldiethoxysilane, γ-mercaptopropyltrimethoxysilane, γ-mercaptopropyltriethoxysilane, γ-mercaptopropyltriisopropoxysilane, γ-mercaptopropyltri-t-butoxysilane; β-(3,4-epoxycyclohexyl)ethyltrimethoxysilane, β-(3,4-epoxycyclohexyl)ethyltriethoxysilane; and partially hydrolyzed products of these compounds; and mixtures of these products.

Particularly, polysiloxane containing a fluoroalkyl group is preferably used. Specific examples of the polysiloxane include hydrolyzed condensates or hydrolyzed co-condensates of one or two or more of the following fluoroalkylsilanes. Those which are generally known as fluorine type silane coupling agents may be used.

$CF_3(CF_2)_3CH_2CH_2Si(OCH_3)_3$;
$CF_3(CF_2)_5CH_2CH_2Si(OCH_3)_3$;
$CF_3(CF_2)_7CH_2CH_2Si(OCH_3)_3$;
$CF_3(CF_2)_9CH_2CH_2Si(OCH_3)_3$;
$(CF_3)_2CF(CF_2)_4CH_2CH_2Si(OCH_3)_3$;
$(CF_3)_2CF(CF_2)_6CH_2CH_2Si(OCH_3)_3$;
$(CF_3)_2CF(CF_2)_8CH_2CH_2Si(OCH_3)_3$;
$CF_3(C_6H_4)C_2H_4Si(OCH_3)_3$;
$CF_3(CF_2)_3(C_6H_4)C_2H_4Si(OCH_3)_3$;
$CF_3(CF_2)_5(C_6H_4)C_2H_4Si(OCH_3)_3$;
$CF_3(CF_2)_7(C_6H_4)C_2H_4Si(OCH_3)_3$;
$CF_3(CF_2)_3CH_2CH_2SiCH_3(OCH_3)_2$;
$CF_3(CF_2)_5CH_2CH_2SiCH_3(OCH_3)_2$;
$CF_3(CF_2)_7CH_2CH_2SiCH_3(OCH_3)_2$;
$CF_3(CF_2)_9CH_2CH_2SiCH_3(OCH_3)_2$;
$(CF_3)_2CF(CF_2)_4CH_2CH_2SiCH_3(OCH_3)_2$;
$(CF_3)_2CF(CF_2)_6CH_2CH_2SiCH_3(OCH_3)_2$;
$(CF_3)_2CF(CF_2)_8CH_2CH_2SiCH_3(OCH_3)_2$;
$CF_3(C_6H_4)C_2H_4SiCH_3(OCH_3)_2$;
$CF_3(CF_2)_3(C_6H_4)C_2H_4SiCH_3(OCH_3)_2$;
$CF_3(CF_2)_5(C_6H_4)C_2H_4SiCH_3(OCH_3)_2$;
$CF_3(CF_2)_7(C_6H_4)C_2H_4SiCH_3(OCH_3)_2$;
$CF_3(CF_2)_3CH_2CH_2Si(OCH_2CH_3)_3$;
$CF_3(CF_2)_5CH_2CH_2Si(OCH_2CH_3)_3$;
$CF_3(CF_2)_7CH_2CH_2Si(OCH_2CH_3)_3$;
$CF_3(CF_2)_9CH_2CH_2Si(OCH_2CH_3)_3$; and
$CF_3(CF_2)_7SO_2N(C_2H_5)C_2H_4CH_2Si)OCH_3)_3$ The use of the polysiloxane containing such a fluoroalkyl group as aforementioned greatly improves the ink-repellency of the unexposed portion of the wettability-changeable layer and allows the wettability-changeable layer to develop the function to prevent the sticking of the composition for functional portions such as coloring ink.

Examples of the above reactive silicone (2) may include compounds having the skeleton represented by the following formula:

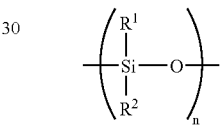

wherein n denotes an integer of 2 or more, $R^1$ and $R^2$ respectively represent a substituted or unsubstituted alkyl, alkenyl, aryl or cyanoalkyl group having 1 to 10 carbon atoms wherein 40% or less by mol ratio of the total mols is vinyl, phenyl and halogenated phenyl. Also, those in which $R^1$ and $R^2$ are methyl groups are preferable because the surface energy is the smallest and the content by mol ratio of methyl groups is preferably 60% or more. Also, at least one or more reactive groups such as a hydroxyl group are contained in a molecular chain at the chain terminal or the side chain.

A stable organosilicone compound, such as dimethylpolysiloxane, which does not participate in a crosslinking reaction may be mixed together with the aforementioned organopolysiloxane.

The wettability-changeable layer in the present invention may further contain a surfactant. Specific examples of the surfactant include nonionic surfactants such as hydrocarbon type surfactants, e.g., each series of NIKKOL BL, BC, BO and BB manufactured by Nikko Chemicals and fluorine type or silicone type nonionic surfactants, e.g., ZONYL, FSN and FSO manufactured by Du Pont, Sarfron S-141 and 145 manufactured by Asahi Glass, Megafac F-141 and 144 manufactured by Dainippon Ink & Chemicals Inc., Ftergent F-200 and F251 manufactured by Neosu, Unidine DS-401 and 402 manufactured by Daikin Industries and Flowlad FC-170 and 176 manufactured by 3 M. Also, cationic surfactants, anionic surfactants and amphoteric surfactants may be used. Also, cationic surfactants, anionic surfactants and amphoteric surfactants may be used.

Further, the wettability-changeable layer may contain, besides the above surfactant, oligomers or polymers such as polyvinyl alcohol, unsaturated polyester, acrylic resins, polyethylene, diallyl phthalate, ethylenepropylenediene monomer, epoxyresins, phenolresins, polyurethane, melamine resins, polycarbonate, polyvinyl chloride, polyamide, polyimide, styrene-butadiene rubber, chloroprene rubber, polypropylene, polybutylene, polystyrene, polyvinyl acetate, polyester, polybutadiene, polybenzimidazole, polyacrylnitrile, epichlorohydrin, polysulfide and polyisoprene.

Such a wettability-changeable layer may be formed by dispersing the aforementioned components together with, as required, other additives in a solvent to prepare a coating solution, which is then applied to substrate. As the solvent to be used, alcoholic organic solvent such as ethanol and isopropanol are desirable. The coating may be carried out using a known coating method such as spin coating, spray coating, dip coating, roll coating and beads coating. In addition, in the case where a ultraviolet ray-curable component is contained, ultraviolet rays are applied to carry out hardening treatment, whereby the wettability-changeable layer can be produced.

In the present invention, the thickness of the wettability-changeable layer is preferably 0.001 μm to 1 μm and particularly preferably in a range from 0.01 to 0.1 μm in view of change rate of wettability which is changed by the photocatalyst.

In the present invention, the use of the wettability-changeable layer having the aforementioned components ensures that the wettability of the exposed portion is changed, making use of actions such as oxidation and decomposition of organic groups and additives which are parts of the above components by the action of the photocatalyst contained in the photocatalyst-containing layer which is in contact with the wettability-changeable layer, to make the wettability-changeable layer ink-philic, making it possible to cause a large difference in wettability between the exposed portion and the unexposed portion. Therefore, by improving acceptability (ink-philic ability) and repulsive ability (ink-repellency) for compositions for functional portions such as coloring ink, functional elements such as color filters which have high qualities and are advantageous in view of cost can be obtained.

(Decomposition-removable Layer)

Next, explanations will be added as to the decomposition-removable layer. This decomposition removable-layer has the characteristics that the decomposition-removable layer of the exposed portion is decomposed and removed by the action of the photocatalyst contained in the photocatalyst-containing layer when exposed to light. For example, in FIG. 1, when the characteristic-changeable layer 5 is the decomposition-removable layer, the characteristic-changeable section shown in FIG. 1(C) is eventually decomposed and removed by the action of the photocatalyst and the pattern of the decomposition-removable layer 10, that is, the decomposition-removable layer 10 is removed as shown in FIG. 1(C'), with the result that a pattern-forming body in which the underlying substrate 4 is exposed and a pattern of irregularities is formed can be obtained. Also, in FIG. 2, similarly, a pattern-forming body can be obtained in which the decomposition-removable layer 10 on the substrate 4 is removed so that the substrate 4 is exposed and a pattern of irregularities is formed (see FIG. 2(D')).

Since, in the decomposition-removable layer, the exposed portion is decomposed and removed by the action of the photocatalyst as aforementioned, a pattern consisting of sections where the decomposition-removable layer exists and sections where no decomposition-removable layer exists, namely a pattern having irregularities can be formed without performing a developing process and a washing process. Therefore, materials, such as various printing master plates, requiring a pattern of irregularities can be formed with ease by this method. Also, because the decomposition-removable layer of the exposed portion can be decomposed and removed by forming this decomposition-removable layer by application on a screen and allowing the decomposition-removable layer to be in contact with the photocatalyst-containing layer-side substrate to carry out pattern exposure, a master plate for screen printing can be formed without performing developing and washing processs. Moreover, when this decomposition-removable layer is formed using a material having the characteristics of a resist, a pattern of a resist can be formed by allowing the decomposition-removable layer to be in contact with the photocatalyst-containing layer-side substrate to carry out pattern exposure. It is therefore possible to use this decomposition-removable layer as a photoresist which does not require a developing process and a washing process in, for example, a process for the production of a semiconductor.

It is to be noted that since this decomposition-removable layer is, for example, oxidation-decomposed and vaporized by the action of the photocatalyst excited by exposure to light, it is removed without performing any particular after-treatment such as developing and washing processs; however, a washing process and the like maybe carried out depending on the type of material used for the decomposition-removable layer.

In the case where the decomposition-removable layer is used, not only irregularities are formed but also a pattern can be formed based on a difference in characteristics between the exposed member which is exposed by the decomposition-removal operation and the decomposition-removal layer. Examples of such characteristics may include various types such as adhesion and color developing ability. Among these characteristics, wettability may be exemplified in this invention. It is preferable to form a pattern based on a difference in wettability in the point of effectiveness in the case of forming an element finally.

Specifically, in the present invention, a structure is preferred in which the decomposition-removable layer is different in the contact angle with water from the exposed member which is exposed when this decomposition-removable layer is decomposed and removed. It is more preferable that, particularly, the contact angle of the decomposition-removable layer with water be larger than the contact angle of the exposed member with water. It is particularly preferable that the contact angle of the decomposition-removable layer with water be 60 degrees or more.

This reason is as follows. Specifically, in the present invention, the unexposed portion is a portion where the decomposition-removable layer remains, namely the unexposed portion becomes a convex portion. Therefore, it is more preferable to stick the composition for functional portions to the concave portion where the decomposition-removable layer is removed and the exposed member is exposed than to the convex portion. For this, the decomposition-removable layer preferably exhibits ink-repellency so as to be resistant to the sticking of the composition for functional portions thereto. So it is preferable that the contact angle of the decomposition-removable layer with water be larger than the contact angle of the exposed member with water. When the contact angle of the decomposition removable layer with water is smaller than 60 degrees, only insufficient ink-repellency is obtained, affording possibility for a presence of the residue of the composition for functional portions such as coloring ink and therefore such a contact angle out of the above defined range is undesirable.

Materials used for this decomposition-removable layer are those having the aforementioned characteristics required for the decomposition-removable layer; specifically, those which are decomposed and removed by the action of the photocatalyst which is excited by exposure and contained in the photocatalyst-containing layer which is in contact with the decomposition-removable layer and preferably those having a contact angle of 60 degrees or more with water.

Examples of these materials include hydrocarbon type, fluorine type or silicone type nonionic surfactants. Specific examples of these surfactants include polyoxyethylene alkyl ether, polyoxyethylene alkylphenyl ether, perfluoroalkylethylene oxide adducts and perfluoroalkylamine oxide.

Examples of such a material available as hydrocarbon type nonionic surfactants include each series of NIKKOL BL, BC, BO and BB (trademarks, manufactured by Nippon Surfactant Industries) and examples of a material available as fluorine type or silicone type nonionic surfactants include ZONYL, FSN and FSO (trademark, manufactured by Du Pont), Sarfron S-141 and 145 (trademark, manufactured by Asahi Glass), Megafac F-141 and 144 (trademark, manufactured by Dainippon Ink & Chemicals Inc.), Ftergent F-200 and F251 (trademark, manufactured by Neosu), Unidine DS-401 and 402 (trademark, manufactured by Daikin Industries) and Flowlad FC-170 and 176 (trademark, manufactured by 3 M.

Also, cationic surfactants, anionic surfactants and amphoteric surfactants may be used as the material for the decomposition-removable layer. Specific examples of these surfactant for the decomposition-removable layer may include sodium alkylbenzenesulfonate, alkyltrimethylammonium salts, perfluoroalkyl carboxylate, perfluoroalkylbetaine.

Further, as the material for the decomposition-removable layer, various polymers or oligomers besides the above surfactant may be used. Examples of these polymers and oligomers may include polyvinyl alcohol, unsaturated polyester, acrylic resins, polyethylene, diallyl phthalate, ethylenepropylenediene monomers, epoxy resins, phenol resins, polyurethane, melamine resins, polycarbonate, polyvinyl chloride, polyamide, polyimide, styrene-butadiene rubber, chloroprene rubber, polypropylene, polybutylene, polystyrene, polyvinyl acetate, nylon, polyester, polybutadiene, polybenzimidazole, polyacrylnitrile, epichlorohydrin, polysulfide and polyisoprene. Among these compounds, an ink-repellent polymer having a high contact angle with water such as polyethylene, polypropylene, polystyrene or polyvinyl chloride is preferably used in the present invention.

Such a decomposition-removable layer may be formed by dispersing the aforementioned components together with, as required, other additives in a solvent to prepare a coating solution, which is then applied to the substrate or the exposed member. (the substrate and the exposed member may be common with each other). The coating may be carried out using a known coating method such as spin coating, spray coating, dip coating, roll coating and beads coating.

In the present invention, the thickness of the decomposition-removable layer is preferably 0.001 µm to 1 µm and particularly preferably in a range from 0.01 to 0.1 µm in view of decomposition rate which is changed by the photocatalyst.

(Substrate)

In the process for the formation of a pattern-forming body according to the present invention, the characteristic-changeable layer is preferably formed on the substrate 4 as shown in FIG. 1 and FIG. 2 in consideration of strength and final functional elements. Examples of the substrate may include glass, metals such as aluminum and its alloys, plastics, fabrics and nonwoven fabrics according to the use of the pattern-forming body or functional elements formed using the pattern-forming body.

Also, when the characteristic-changeable layer is the decomposition-removable layer as aforementioned, an exposed member may be interposed between the substrate and the decomposition-removable layer. This exposed member is, as mentioned above, a member to be exposed when the decomposition-removable layer is decomposed and removed by the action of the photocatalyst excited by exposure to light and is preferably formed of a material differing in characteristics from the decomposition-removable layer. As aforementioned, particularly in the case where the above characteristics are wettability, a material having a contact angle of 30 degrees or less with water is preferable. As examples of materials meeting the above requirements, inorganic materials such as glass ceramics and polymer materials whose surfaces are processed by hydrophilic treatment using a plasma or a coupling agent may be given.

It is to be noted that in the present invention, it is unnecessary to dispose the exposed member separately when the above substrate has a function as the exposed member.

(Contact Between the Photocatalyst-containing Layer and the Characteristic-changeable Layer)

Figure 2A:
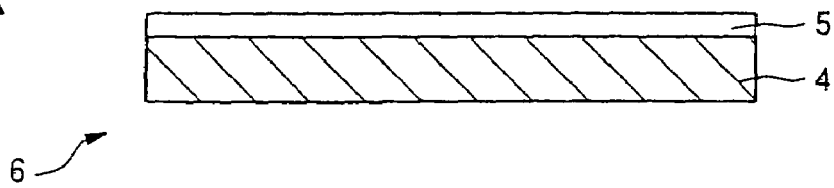
Figure 2B:
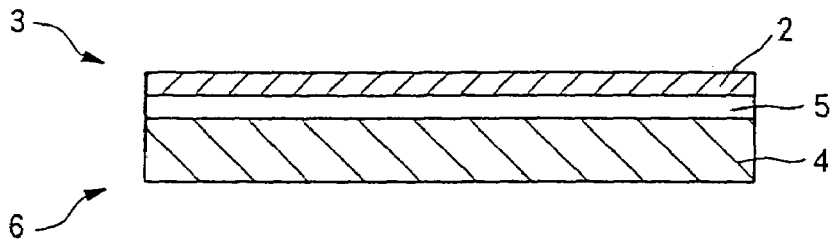
Figure 2C:
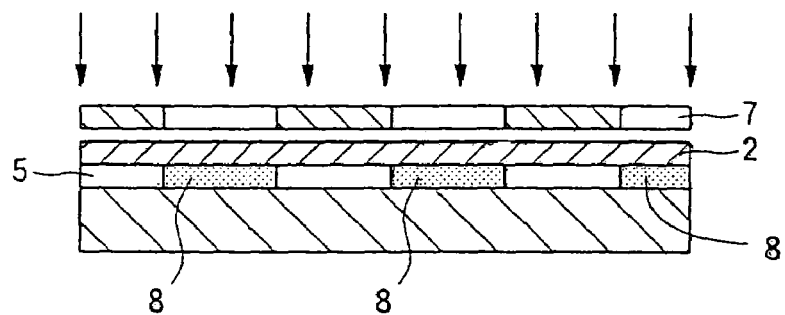

In the present invention, as shown in FIG. 1(B) and FIG. 2(C), it is necessary to dispose the photocatalyst-containing layer 2 of the photocatalyst-containing layer-side substrate 3 and the characteristic-changeable layer 5 of the pattern-forming body substrate 6 such that the both layers are in contact with each other during exposure.

Here, the "contact" meant in the present invention implies the condition of the photocatalyst-containing layer disposed such that the action of the photocatalyst substantially extends to the characteristic-changeable layer, including the condition of the photocatalyst-containing layer which is formed by application and stuck to the characteristic-changeable layer as shown in FIG. 2(C), the condition of the photocatalyst-containing layer which is actually brought into contact with the characteristic-changeable layer as shown in FIG. 1(B) and further the case where even if, for example, there is no actual contact between these layers, water, air or the like intervenes between these layers so that the action of the photocatalyst contained in the photocatalyst-containing layer extends to the characteristic-changeable layer. In the present invention, such a contact condition may be kept at least only during exposure.

(Exposure)

In the present invention, after the photocatalyst-containing layer 2 of the photocatalyst-containing layer-side substrate 3 and the characteristic-changeable layer 5 of the pattern-forming body substrate 6 such that these layers are in contact with each other, exposure is carried out as shown in FIG. 1(B) and FIG. 2(C).

The formation of a pattern by exposure in the present invention may be attained by exposure to light through the photomask 7 as shown in FIG. 1(B) and FIG. 2(c) or by light drawing irradiation using laser light or the like.

In the case of using the above photomask, a fine pattern can be formed by using a reduction projection printing method for reducing a mask pattern image with a reduction optical system. As such a photomask, those formed on a metal plate such as a deposition mask, those formed of metal chrome on a glass plate and the like may be used and a plate-making film may be used in printing applications.

On the other hand, in the case of light drawing irradiation using laser light, a predetermined pattern may be directly drawn by using a predetermined drawing irradiation system without using a photomask.

The wavelength of light used for the exposure is usually designed to be in a range of 400 nm or less and preferably 380 nm or less but not limited to this range. For example, it is possible to make the characteristic-changeable layer sensitive to visible light and to light having other wavelengths by doping with ions of a metal such as chrome, platinum or palladium or by adding a fluorescent material or a light-sensitive dye. Examples of such a dye include cyanine dyes such as a cyanine dye, carbocyanine dye, dicarbocyanine dye and hemicyanine dye. Examples of other useful dyes may include crystal violet, triphenylmethane dyes such as basic fuchsine, diphenylmethane dyes, xanthene dyes such as Rhodamine B, Victoria Blue, Brilliant Blue, Malachite Green, Methylene Blue, pyrylium salts, benzopyrylium salts, trimethinebenzopyrylium salts and triallylcarbonium salts.

Examples of a light source which may be used for the exposure may include a mercury lamp, metal halide lamp, xenon lamp, excimer lamp, excimer laser, YAG laser and other various light sources.

The exposure dose at the time of exposure is designed to be the exposure dose required to change the characteristics of the characteristic-changeable layer by the action of the photo-catalyst. At this time, the sensitivity can be raised by carrying out exposure while heating the photocatalyst-containing layer. This is important particularly when light drawing irradiation is used.

It is to be noted that although the exposure is performed from the side of the photocatalyst-containing layer-side substrate 3 in the examples shown in FIG. 1(B) and FIG. 2(C), the direction of the exposure is not limited to the above in the present invention and exposure from the side of the pattern-forming body substrate 4 is allowed if the substrate 4 and the characteristic-changeable layer 5 transmit light.

The exposure performed in this manner brings about the result that the exposed characteristic-changeable layer 5 is changed to the characteristic-changeable section 8 formed pattern-wise as shown in FIG. 1(B) and FIG. 2(C). The characteristic-changeable portion is a wettability-changeable section if the characteristic-changeable layer is the wettability-changeable layer, is a section differing in adhesion if the characteristic-changeable layer is the adhesion-changeable layer changed in adhesion and is a section where a concave portion is formed if the characteristic-changeable layer is the decomposition-removable layer which is to be decomposed and removed.

(Dismounting of the Photocatalyst-containing Layer-side Substrate)

Figure 2D:
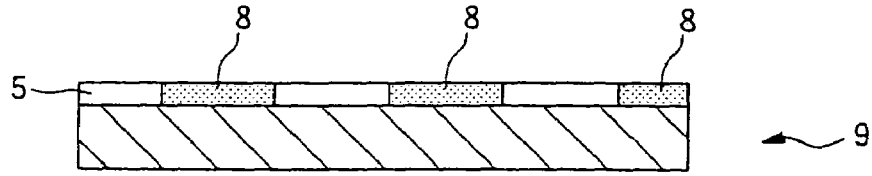
Figure 2D:
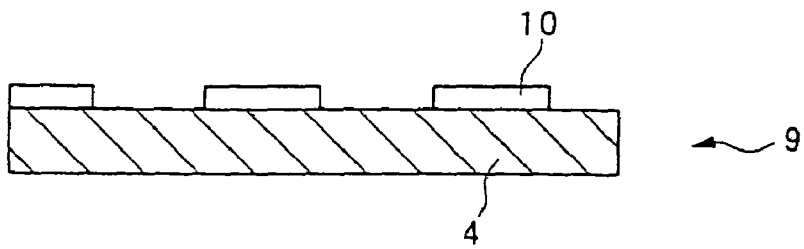

In the present invention, as shown in FIG. 1(C) and FIG. 2(D), the pattern-forming body 9 is obtained in which a pattern of the characteristic-changeable section 8 is formed on the characteristic-changeable layer 5 by dismounting the photocatalyst-containing layer-side substrate 3 after exposure.

With regard to the dismount of the photocatalyst-containing layer-side substrate in the present invention, if, for example, the photocatalyst-containing layer-side substrate is simply in contact with the characteristic-changeable layer as shown in FIG. 1, it can be dismounted by simply separating the photocatalyst-containing layer-side substrate 3 from the pattern-forming body 9, whereas if, for example, the photocatalyst-containing layer-side substrate 3 is stuck to the pattern-forming body as shown in FIG. 2, it is necessary to peel off the photocatalyst-containing layer-side substrate by using an adhesive tape.

(Pattern-forming Body)

The pattern-forming body thus obtained has a structure in which a pattern of characteristic-changeable section is formed on the characteristic-changeable layer. Therefore, when the characteristics of the characteristic-changeable layer are wettability, the section which has been changed in wettability is changed in acceptability for printing ink and therefore the pattern-forming body can be used as a printing plate. When the pattern-forming body of the present invention is used as a printing master plate, this has the effects that it is unnecessary to perform wet developing and the like and the production of the printing plate is completed at the same time when exposure is completed.

Also, when the characteristic-changeable layer is the decomposition-removable layer, the exposed portion is decomposed and removed by the action of the photocatalyst, so that the pattern-forming body becomes a pattern having irregularities. The pattern having these irregularities therefore may be used as various printing master plates and the like. Also, when the substrate is a screen and the decomposition-removable layer is formed as the characteristic-changeable layer on the screen, the exposed portion is decomposed and removed so that a pattern-forming body consisting of stuffed portions and void portions of the screen can be obtained and can be used as a screen printing master plate.

(Functional Elements)

Moreover, various functional elements can be obtained by disposing functional portions on the sections corresponding to the pattern formed on the pattern-forming body.

Here, the functionality implies various functions such as optical functions (e.g., light-selective absorption, reflecting characteristics, polarizability, light-selective transmittance, nonlinear optics, luminescence including fluorescence and phosphorescence and photochromic characteristics), magnetic functions (e.g., hard magnetism, soft magnetism, non-magnetism and magnetic permeability), electric or electronic functions (e.g., conductivity, insulation, piezo-electric characteristics, pyroelectric characteristics and dielectric characteristics), chemical functions (e.g., adsorbing ability, desorbing ability, catalytic ability, water-absorbing ability, ion conductivity, oxidation-reduction ability, electrochemical characteristics and electrochromic characteristics), mechanical functions (e.g., wear resistance), thermal functions (e.g., heat conductivity, heat insulation and infrared radiation ability) and biological functions (e.g., biological adaptability and anti-thrombogenic ability.

There are various methods to dispose such functional portions on the sections corresponding to the pattern of the pattern-forming body depending on the characteristics of the characteristic-changeable layer. When the characteristic-changeable layer is, for example, the adhesion-changeable layer which is changed in adhesion, a pattern changed in adhesion has been formed on the pattern-forming body. Therefore, a metal pattern as the functional portions is formed on only highly adhesive portions by depositing a composition for functional portions such as a metal over the entire surface of the characteristic-changeable layer and thereafter peeling off the deposited film by using an adhesive or the like. Circuits or the like can be thereby formed with ease.

When the characteristic-changeable layer is the decomposition-removable layer, a pattern which has been changed in irregularities is formed. Accordingly, functional portions can be disposed easily at sections corresponding to the pattern by inserting and sticking a composition for functional portions to the concave portions. In this case, when there is a difference in wettability between the concave portions and the convex portions, specifically if the concave portions are highly wettable ink-philic regions and the convex portions are less wettable ink-repellent regions, the composition for functional portions can be inserted and stuck more easily.

When the characteristic-changeable layer is the wettability-changeable layer, a pattern which has been changed in wettability is formed. Therefore, if a composition for functional portions is applied to the pattern-forming body, the composition for functional portions is stuck to only highly wettable ink-philic regions. Therefore, the functional portions can be disposed with ease at the sections corresponding to the pattern of the pattern-forming body. In this case, it is desirable that the unexposed portion of the pattern-forming body have a critical surface tension of 50 mN/m or less and preferably 30 mN/m or less.

The types of composition for functional portions used in the present invention largely differ depending on the functions of functional elements and methods for the formation of functional elements as aforementioned. In the case of forming a metal pattern on the basis of a difference in, for example, adhesion, the composition for functional portions is a metal. Also, in the case of using the pattern-forming bodies changed in wettability or irregularities, compositions represented by ultraviolet-curable monomers and the like which are not diluted with a solvent or liquid compositions diluted with a solvent may be used. In the case of the liquid composition diluted with a solvent, the solvent is preferably water, ethylene glycol or the like, which exhibits high surface tension. Also, as the viscosity of the composition for functional portions is decreased, the pattern can be formed in a shorter time and therefore the characteristic-changeable layer is particularly preferably a wettable-changeable layer. On the other hand, in the case of the liquid composition diluted with a solvent, a rise in viscosity and a change in surface tension caused by the vaporization of the solvent take place during the formation of the pattern and the solvent is therefore preferably less volatile.

The composition for functional portions to be used in the present invention maybe those which become the functional portions by sticking them to the pattern-forming body to dispose them or those which become the functional portions after treated by chemicals, ultraviolet rays, heat and the like after disposed on the pattern-forming body. In this case, if a component cured by ultraviolet rays, heat, electron rays or the like is contained as the binding agent used for the composition for functional portions, this is preferable because the functional portions can be formed rapidly by performing hardening treatment.

Figure 3:
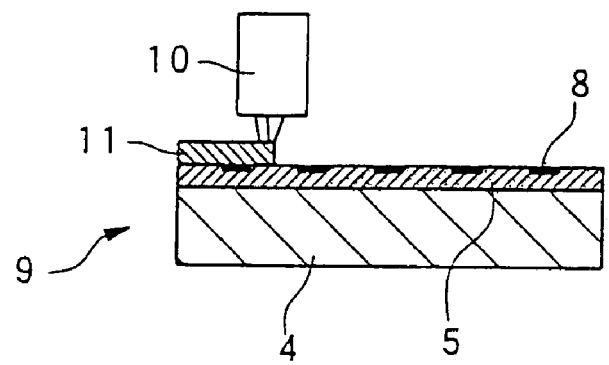
FIG. 3 is a typical sectional view for explaining a process for the production of a functional element according to the present invention.
Figure 4:
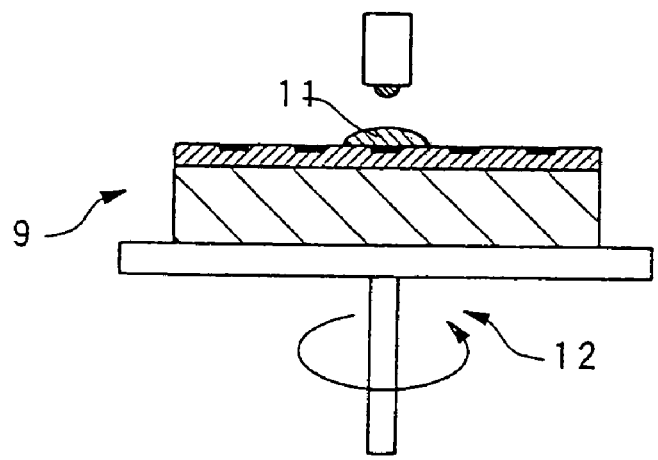
FIG. 4 is a typical sectional view for explaining a process for the production of a functional element according to the present invention.
Figure 5:
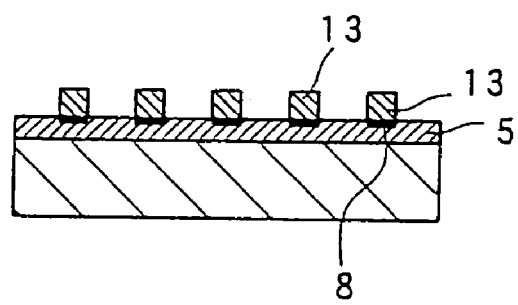
FIG. 5 is a typical sectional view for explaining a process for the production of a functional element according to the present invention.

A process for the formation of a functional element will be explained in detail. When the characteristic-changeable layer is, for example, the wettability-changeable layer, the composition for functional portions forms functional portions on the pattern of the ink-philic regions, formed on the pattern-forming body, by using a coating device such as dip coating, roll coating, blade coating or spin coating or by a means such as nozzle jetting device including an ink jet. As shown in FIG. 3, examples of the process may include a method in which a composition 11 for functional portions is applied using a blade coater 10 on the pattern-forming body 9 provided with the characteristic-changeable sections (ink-philic regions) 8 formed by pattern exposure in the condition that the characteristic-changeable layer 5 formed on the substrate 4 is brought into contact with the photocatalyst-containing layer and a method in which the composition 11 for functional portions is dripped on the similar pattern-forming body 9 and applied by a spin coater 12 as shown FIG. 4. When the composition 11 for functional portions is applied in this manner, the composition for functional portions is stuck to only the characteristic-changeable sections 8 which have been changed in wettability and become ink-philic regions as shown in FIG. 5. This composition for functional portions is cured to form a functional portion 13, whereby a functional element can be formed.

Moreover, if the pattern-forming body of the present invention is used in a method of forming a metal film by electroless plating, functional elements having a metal film pattern as the functional portions can be obtained. This is also an effective method when the characteristic-changeable layer is the wettability-changeable layer. A functional element having a desired pattern on the characteristic-changeable layer can be obtained by treating only the ink-philic regions of the pattern-forming body having a pattern which has been changed in wettability by using a pretreating solution for chemical plating and then dipping the treated pattern-forming body in a chemical plating solution. According to this method, print boards and electronic circuit elements can be produced as functional elements because a metal pattern can be formed without forming a resist pattern.

Figure 6A:
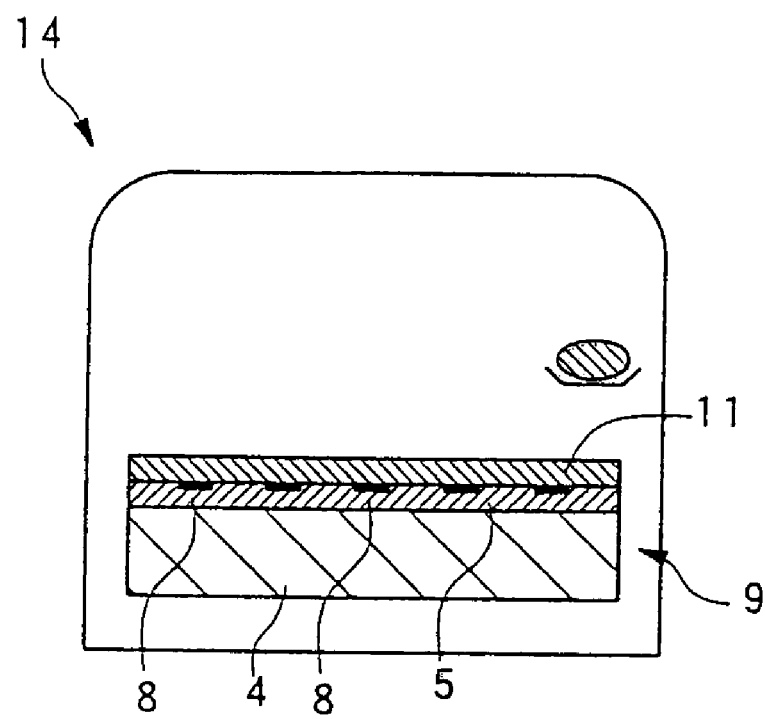
FIG. 6(A) to FIG. 6(C) are typical sectional views for explaining a process for the production of a functional element according to the present invention.
Figure 6B:
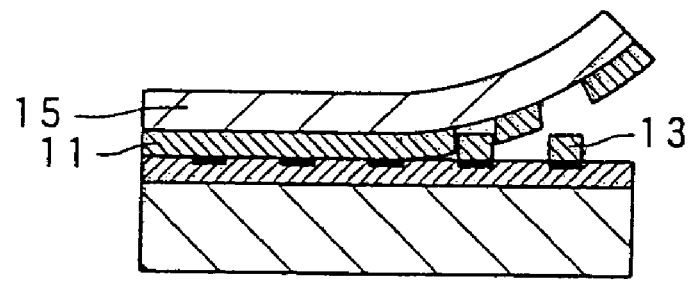
Figure 6C:
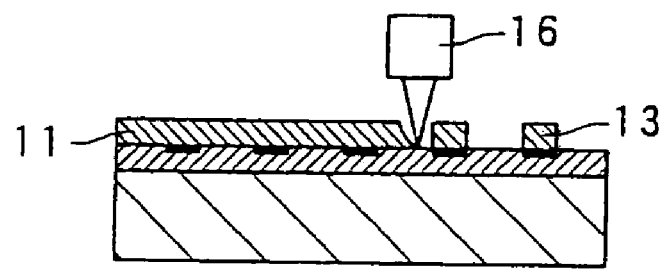
Figure 7A:
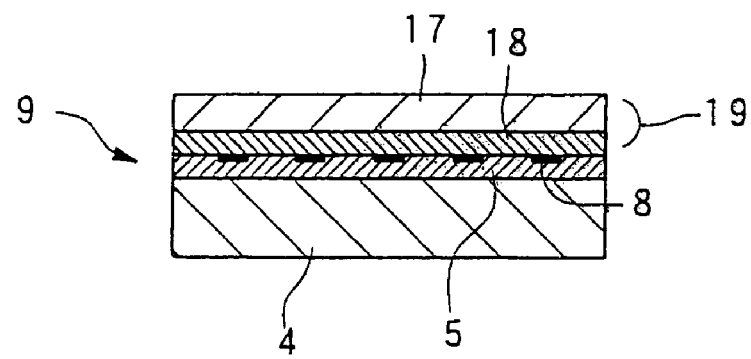
FIG. 7(A) to FIG. 7(D) are typical sectional views for explaining a process for the production of a functional element according to the present invention.
Figure 7B:
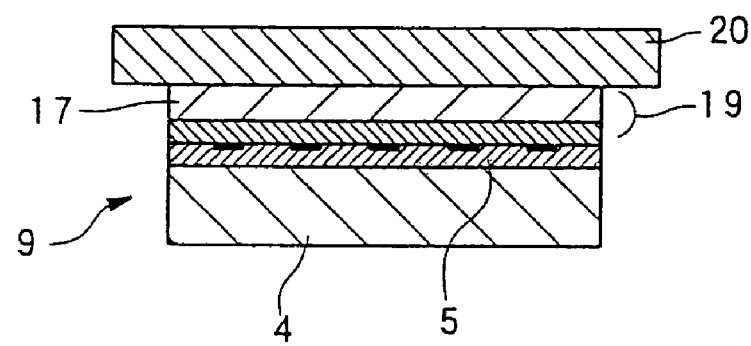
Figure 7C:
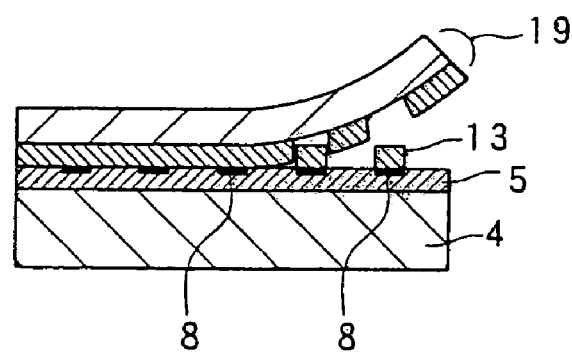
Figure 7D:
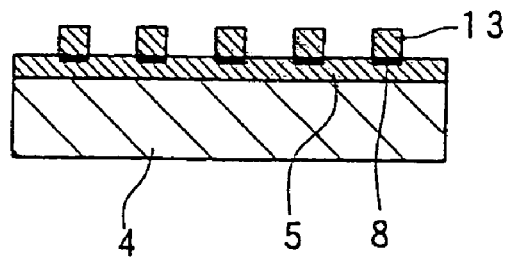

Also, the functional portions may be formed along a pattern by removing unnecessary portions by making use of a difference in characteristics between the exposed portion and the unexposed portion after the composition for functional portions are disposed over the entire surface as mentioned above. This is an effective method particularly when the characteristic-changeable layer is the adhesion-changeable layer. For example, after an adhesive tape is stuck, unnecessary portions are removed by after-treatments such as peeling treatment for peeling off the adhesive tape, air-blowing treatment and treatment using a solvent to enable the preparation of a pattern of the functional portions. Given as examples of a method for disposing functional portions on the entire surface as aforementioned are vacuum film-forming device such as PVD and CVD. Specifically, the composition 11 for functional portions is formed over the entire surface of the pattern-forming body 9 in which the characteristic-changeable layer 5 having a pattern of the characteristic changeable sections 8 is formed on the substrate 4 by using a film-forming device 14 utilizing vacuum such as CVD as shown in FIG. 6(A). Examples of a method of removing the unnecessary portions of the composition 11 for functional portions formed over the entire surface in this manner may include a method in which, as shown in FIG. 6(B), the adhesive tape 15 is peeled off after the adhesive tape is stuck to remove the composition 11 for functional portions on the unexposed portions, thereby forming the functional portions 13 and a method in which, as shown in FIG. 6(C), the composition 11 for functional portions as unnecessary portions is removed by injecting air from an air injection nozzle 16 to thereby enable the formation of the functional portions 13.

Further, FIG. 7 shows a method of forming a functional element which method is particularly effective when the characteristic-changeable layer is the adhesion-changeable layer or the wettability-changeable layer. First, as shown in FIG. 7(A), a thermal transfer body 19 prepared by laminating a heat-meltable composition layer 18 on one surface of a sheet 17 is stuck to the pattern-forming body 9 in which the characteristic-changeable layer 5 having a pattern of the characteristic-changeable sections 8 is formed on the substrate 4 such that the heat-meltable composition layer 18 is in contact with the characteristic-changeable layer 5. Then, as shown in FIG. 7(B), a heating plate 20 is pressed against the thermal transfer body 19 from the side of the sheet 17 and heated. Then, if the thermal transfer body 19 is peeled off after being cooled-as shown in FIG. 7(C), a functional element in which the functional portions 13 are formed along the pattern of the characteristic-changeable sections 8 formed on the characteristic-changeable layer 5 can be obtained (see FIG. 7(D)).

Specific examples of these functional elements obtained in this manner may include color filters and microlenses.

The aforementioned color filters are used for liquid crystal displays and the like and have structures in which plural pixel portions of red, green, blue and the like are formed with a highly precise pattern on a glass substrate or the like. A low cost and highly precise color filter can be produced by using the pattern-forming body of the present invention for the production of the color filter. Namely, for example, if the characteristic-changeable layer is the wettability-changeable layer and this wettability-changeable layer is subjected to pattern exposure, a pattern-forming body in which a pattern which has been changed in wettability is formed is obtained. Then, ink (composition for functional portions) is stuck to the sections (sections changed to ink-philic regions by exposure) which has been changed in wettability by using an ink jet device or the like and cured, whereby pixel portions (functional portions) can be formed with ease. This makes it possible to obtain a highly precise color filter using processs smaller in number.

Figure 8A:
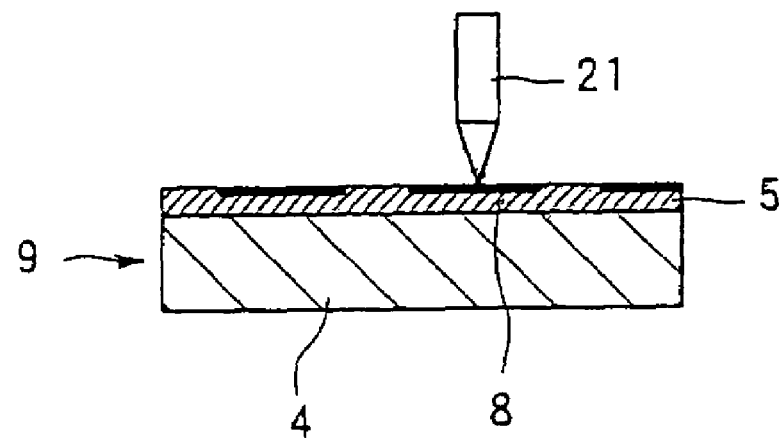
FIG. 8(A) to FIG. 8(C) are typical sectional views for explaining a process for the production of a microlens according to the present invention.
Figure 8B:
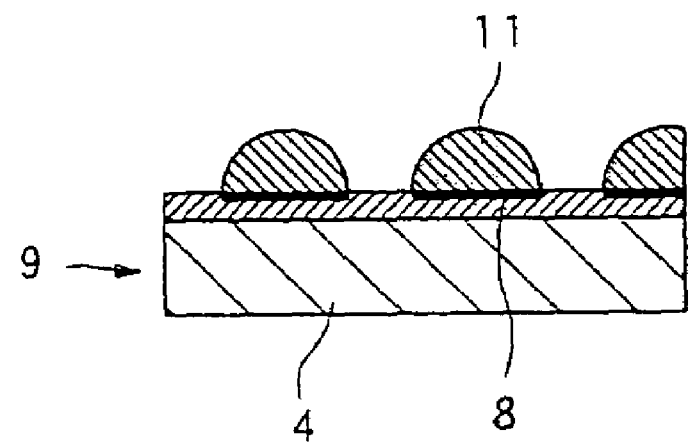
Figure 8C:
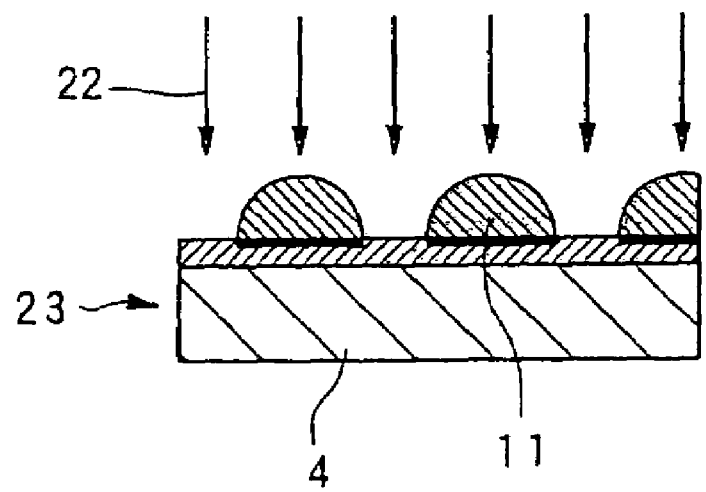

When the functional element is a microlens, a pattern-forming body having a circular pattern which has been changed in wettability on a wettability-changeable layer is produced. Then, when a composition (composition for functional portions) for forming a lens is dripped on the section changed in wettability, the composition spreads on only the ink-philic region and if the composition is further dripped, the contact angle of the liquid droplet can be changed. When this lens-forming composition is cured, lenses having various shapes and focal distances can be obtained and highly precise microlens can be obtained. To explain a method of producing such a microlens with reference to FIG. 8, a pattern-forming body 9 in which a circular pattern of a characteristic-changeable section (ink-philic region) 8 is formed on a characteristic-changeable layer (wettability-changeable layer) 5 is prepared. Then, a composition (ultraviolet-curable resin composition) for functional portions is jetted towards the pattern of the circular characteristic-changeable section (ink-philic region) 8 by using a jetting device 21 (see FIG. 8(A)). This composition 11 for functional portions (ultraviolet-curable resin composition) rises due to a difference in wettability between the ink-philic region as the characteristic-changeable section 8 and an ink-repellent region of the unexposed region (see FIG. 8(B)). A microlens 23 is formed by curing this composition by using a resin-curing ultraviolet ray 22 (see FIG. 8(C)).

EXAMPLES

The present invention will be hereinafter explained in more detail by way of examples.

Example 1

1. Formation of a Photocatalyst-containing Layer-side Substrate 30 g of isopropyl alcohol, 0.4 g of MF-160E (trademark, manufactured by Tochem Products) using fluoroalkylsilane as its major component, 3 g of trimethoxymethylsilane (manufactured by Toshiba Silicone, trademark: TSL8113) and 20 g of ST-K01 (trademark, manufactured by Ishihara Sangyo Inc.) which was a titanium dioxide/water dispersion as a photocatalyst were mixed and stirred at 100° C. for 20 minutes. The resulting mixture was diluted with isopropyl alcohol to bring the total volume to three times the original, thereby preparing a composition for a photocatalyst-containing layer.

The above composition was applied to a transparent substrate made of soda glass by a spin coater and was subjected to drying treatment performed at 150° C. for 30 minutes to form a transparent photocatalyst-containing layer (thickness: 0.2 µm), thereby forming a photocatalyst-containing layer-side substrate.

2. Formation of a Pattern-forming Body Substrate

First, a composition for a wettability-changeable layer comprising the following composition was prepared.

(Percentage Composition of the Composition for a Wettability-changeable Layer)

| | |
|---|---|
| Silicone coating agent (manufactured by Toshiba Silicone, trademark: YSR3022, percentage composition: polyalkylsiloxane and polyalkylhydrogensiloxane (30 wt %), methyl ethyl ketone (10 wt %) and toluene (60 wt %)) | 100 parts by weight |
| Catalyst (manufactured by Toshiba Silicone, trademark: YC6831, percentage composition: organic tin compound (40 wt %) and toluene (60 wt %)) | 4 parts by weight |
| Toluene | 400 parts by weight |

This composition for a wettability-changeable layer was applied to a substrate made of soda glass by a spin coater and heated at 100° C. for 10 minutes to form a wettability-changeable layer having a thickness of 3 µm, thereby forming a pattern-forming body substrate.

3. Exposure

The photocatalyst-containing layer-side substrate was mounted on the wettability-changeable layer of the pattern-forming body substrate such that the photocatalyst-containing layer of the photocatalyst-containing layer-side substrate was in contact with the wettability-changeable layer. The both layers were exposed to light at an illuminance of 70 mW/cm$^2$ for 60 seconds by using a mercury lamp (wavelength: 365 nm) from the side of the photocatalyst-containing layer to form a characteristic-changeable section (ink-philic region). The contact angle of the wettability-changeable layer with water before and after the exposure was measured (30 seconds after water droplets were dripped from microsyringe) using a contact angle-measuring meter (CA-Z type, manufactured by Kyowa Kaimen Kagaku). As a result, the contact angle with water before the exposure was 110 degrees whereas the contact angle with water after the exposure was 7 degrees. The exposed characteristic-changeable sections became ink-philic regions and it was confirmed that a pattern based on a difference in wettability between the exposed portion and the unexposed portion could be formed.

4. Formation of a Pattern

A pattern-forming body was obtained by carrying out exposure through a photomask having a 100 µm-line & space pattern in the same manner as in the above exposure. A red colorant having the following percentage composition was applied to the pattern-forming body by using a dip coater and cured using UV rays to form a 100 µm-line & space red pattern.

(Composition of the Red Colorant)

| | |
|---|---|
| UV-curable resin (ester acrylate resin: manufactured by Arakawa Kagaku Kogyo, | 10 parts by weight |

-continued

| | |
|---|---|
| trademark: AQ-11) | |
| Hardening initiator (1-hydroxycyclohexyl phenyl ketone, manufactured by Ciba Speciality Chemicals, trademark: Irgacure 184) | 0.5 parts by weight |
| Red dye (manufactured by Tokyo Kasei, trademark: Rose bengale) | 0.5 parts by weight |

5. Production of a Color Filter

A wettability-changeable layer was formed on a transparent substrate made of non-alkali glass in the same manner as above to obtain a pattern-forming body substrate. The pattern-forming body substrate was exposed through a negative type photomask with lines of 280 μm-open portions being arranged at a pitch of 300 μm in the same manner as in the case of the above exposure to obtain a pattern-forming body.

A composition for each pixel portion having the following percentage composition was jetted to the exposed portion (characteristic-changeable sections, ink-philic regions) of the pattern-forming body by using a liquid precision jetting device (Dispenser manufactured by EED, trademark: 1500XL-15) and then subjected to heating treatment performed at 100° C. for 45 minutes to form a pixel portion consisting of a red pattern, a blue pattern and a green pattern. A two-solution mixed type thermohardening agent (manufactured by JSR, trademark: SS7265) as a protective layer was applied to the pixel portion by using a spin coater and then subjected to hardening treatment performed at 200° C. for 30 minutes to form a protective layer, thereby obtaining a color filter.

(Percentage Composition of the Composition for the Pixel Portion)

| | |
|---|---|
| Pigments (Pigment Red 168, Pigment Green 36 and Pigment Blue 60) | 3 parts by weight |
| Nonionic surfactant (manufactured by Nikko Chemicals, trademark: NIKKOL BO-10TX) | 0.05 parts by weight |
| Polyvinyl alcohol (manufactured by Shin-Etsu Chemical Co. Ltd., trademark: Shinetsu Poval AT) | 0.6 parts by weight |
| Water | 97 parts by weight |

Example 2

1. Preparation of a Photocatalyst-containing Layer-side Substrate and a Pattern-forming Body Substrate A pattern-forming body substrate was prepared in the same manner as in Example 1. Thereafter, the same composition for a photocatalyst-containing layer as that used in Example 1 was applied to the wettability-changeable layer of the pattern-forming body substrate by a spin coater and heated at 150° C. for 30 minutes to form a photocatalyst-containing layer with a thickness of 0.2 μm, thereby preparing a photocatalyst-containing layer-side substrate.

2. Exposure

The photocatalyst-containing layer-side substrate was exposed to light from the side of the photocatalyst-containing layer in the same manner as in Example 1. Then, an adhesive tape (manufactured by Sumitomo 3M, trademark: Scotch Tape) was stuck to the photocatalyst-containing layer under pressure and then peeled off at a rate of 1 mm/sec. to peel off the photocatalyst-containing layer. The contact angle of the wettability-changeable layer with water before and after the exposure was measured in the same manner as in Example 1. As a result, the contact angle with water before the exposure was 95 degrees whereas the contact angle with water after the exposure was 7 degrees. The exposed characteristic-changeable sections became ink-philic regions and it was confirmed that a pattern based on a difference in wettability between the exposed portion and the unexposed portion could be formed.

Example 3

1. Formation of a Photocatalyst-containing Layer-side Substrate 15 g of ethanol, 15 g of isopropyl alcohol and 30 g of ST-K03 (trademark, manufactured by Ishihara Sangyo) which was a water dispersion of titanium dioxide as a photocatalyst were mixed and stirred at 100° C. for 20 minutes to prepare a composition for a photocatalyst-containing layer. This composition was applied to a transparent substrate made of soda lime glass by a dip coater and was subjected to heat treatment performed at 150° C. for 10 minutes to form a transparent photocatalyst-containing film (thickness: 0.2 μm), thereby forming a photocatalyst-containing layer-side substrate.

2. Formation of a Pattern-forming Body Substrate 2 wt % of a fluorine type nonionic surfactant ZONYL FSN (trademark, manufactured by Du Pont) was mixed in isopropanol to prepare a composition for a decomposition-removable layer. This composition for a decomposition-removable layer was applied to a transparent substrate made of soda lime glass by a spin coater and heated at 50° C. for 10 minutes to form a decomposition-removable layer having a thickness of 0.1 μm, thereby forming a pattern-forming body substrate.

3. Exposure

The photocatalyst-containing layer-side substrate was mounted on the decomposition-removable layer of the pattern-forming body substrate such that the photocatalyst-containing layer of the photocatalyst-containing layer-side substrate was in contact with the decomposition-removable layer. The both layers were exposed to light at an illuminance of 70 mW/cm$^2$ for 2 minutes by using a mercury lamp (wavelength: 365 nm) from the side of the photocatalyst-containing layer to decompose and remove the decomposition-removable layer thereby exposing the substrate glass. The contact angle with water before and after the exposure, specifically, the contact angle of the surface of the decomposition-removable layer with water and the contact angle of the exposed glass surface after the exposure were measured in the same manner as in Example 1. As a result, the contact angle of the surface of the decomposition-removable layer with water was 71 degrees whereas the contact angle, with water, of the glass surface exposed after the exposure was 9 degrees. It was confirmed that a pattern based on a difference in wettability between the exposed portion and the unexposed portion could be formed.

4. Formation of a Microlens

A pattern-forming body was obtained by carrying out exposure through a negative type photomask in which plural 200 μm-circular opening portions are arranged at intervals of 100 μm in the same manner as in the above exposure. A composition for a microlens having the following percentage composition was jetted to the exposed portion of the pattern-forming body at a jetting rate of 0.0001 ml by using a liquid precision jetting device (Dispenser manufactured by EED, trademark: 1500XL-15) and then UV-cured to obtain a microlens array having a diameter of 200 μm and a focal distance of 500 μm.

(Percentage Composition of the Composition for the Microlens)

| | |
|---|---|
| UV-curable resin (ester acrylate resin, manufactured by Arakawa Kagaku Kogyo, trademark: AQ-11) | 10 parts by weight |
| Hardening initiator (1-hydroxycyclohexyl phenyl ketone, manufactured by Ciba Speciality Chemicals, trademark: Irgacure 184) | 0.5 parts by weight |

The present invention is not limited to the aforementioned embodiments. These embodiments are typical examples and any invention having substantially the same structure and the same action effects as the technical spirits described in the scope of the claim of the patent of the present invention is embraced in the technical scope of the present invention.

Figure 9A:
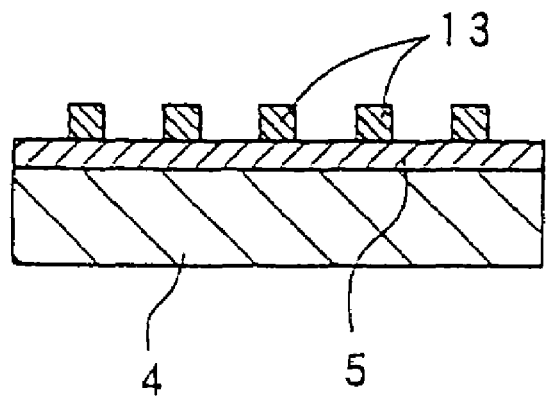
FIG. 9(A) to FIG. 9(C) are typical sectional views for explaining a process for the production of a functional element according to the present invention.
Figure 9B:
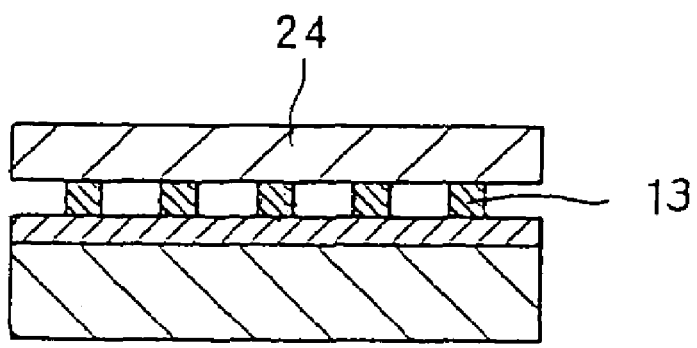
Figure 9C:
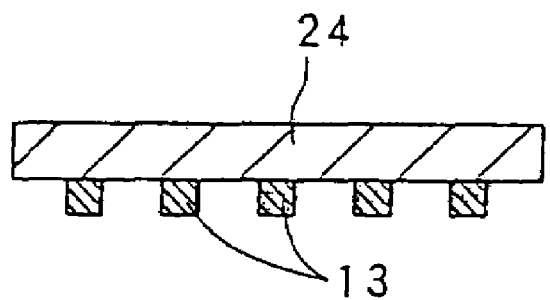

For instance, the foregoing explanations are offered using examples in which the functional elements are all formed on the pattern-forming body. However, the present invention is not limited to these examples. For example, the following structure may be adopted. Specifically, as shown in FIG. 9, first the characteristic-changeable layer 5 is formed on the substrate 4 in the same manner as in the above explanations and the functional portion 13 is formed along the pattern of the characteristic-changeable section of the characteristic-changeable layer 5 (see FIG. 9(A)). Next, an element forming substrate 24 is allowed to stick to the functional portion 13 such that it is in contact with the functional portion 13 (see FIG. 9(B)). Then, the functional portion 13 is transferred to the element forming substrate 24 to form a functional element. As mentioned above, the functional element is not limited to those formed on the pattern-forming body.

What is claimed is:

1. A function element comprising a wettability-changeable layer and a functional portion,
   wherein the wettability-changeable layer is a layer changed in wettability such that a contact angle with water is lowered by an action of a photocatalyst, containing an organopolysiloxane, and excluding a photocatalyst-containing layer;
   wherein the organopolysiloxane has a primary chain which is resistant to deterioration and decomposition caused by the action of the photocatalyst; and further
   wherein the functional portion is disposed on a section corresponding to a pattern formed on a pattern-forming body having the pattern with the wettability changed.

2. The functional element according to claim 1, wherein the organopolysiloxane is a hydrolyzed condensate or hydrolyzed co-condensate of one or two or more silicon compounds represented by the formula: YnSiX(4-n) (wherein Y represents an alkyl group, a fluoroalkyl group, a vinyl group, an amino group, a phenyl group or an epoxy group, X represents an alkoxyl group or a halogen and n denotes an integer of 0 to 3).

3. The functional element according to claim 1, wherein the organopolysiloxane is a polysiloxane containing a fluoroalkyl group.

4. The functional element according to claim 1, wherein the functional portion is a metal.

5. The functional element according to claim 1, wherein the functional portion is formed on a part of the wettability-changeable layer having a smaller contact angle with water.

6. A color filter comprising a pixel portion, wherein the pixel portion is the functional portion of the functional element as claimed in claim 5.

7. A microlens comprising a lens, wherein the lens is the functional portion of the functional element as claimed in claim 5.

* * * * *